(12) United States Patent
Lee et al.

(10) Patent No.: US 8,884,377 B2
(45) Date of Patent: Nov. 11, 2014

(54) CONDUCTIVE LINE STRUCTURES AND METHODS OF FORMING THE SAME

(71) Applicant: Samsung Electronics Co., Ltd., Suwon-Si (KR)

(72) Inventors: Sok-Won Lee, Yongin-si (KR); Joon-Hee Lee, Seongnam-si (KR); Jung-Dal Choi, Hwaseong-si (KR); Seong-Min Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/769,493

(22) Filed: Feb. 18, 2013

(65) Prior Publication Data
US 2013/0214413 A1    Aug. 22, 2013

(30) Foreign Application Priority Data
Feb. 22, 2012 (KR) .......................... 10-2012-0018073

(51) Int. Cl.
*H01L 29/76* (2006.01)
*H01L 29/94* (2006.01)
(Continued)

(52) U.S. Cl.
CPC ............ *H01L 23/52* (2013.01); *H01L 21/0337* (2013.01); *H01L 27/11519* (2013.01); *H01L 21/764* (2013.01); *H01L 21/768* (2013.01); *H01L 27/11524* (2013.01); *H01L 27/1157* (2013.01); *H01L 23/5222* (2013.01); *H01L 23/53295* (2013.01); *H01L 27/11565* (2013.01); *H01L 21/32139* (2013.01)
USPC ............ 257/396; 257/412; 257/413; 257/760; 257/E21.006; 257/E21.007; 257/E21.027; 257/E21.028; 257/E21.17; 257/E21.058; 257/E21.231; 257/E21.249; 257/E21.259; 257/E21.267; 257/E21.278; 257/E21.293; 257/E21.311; 257/E21.32; 257/E21.545; 257/E21.546; 257/E21.547

(58) Field of Classification Search
USPC ......... 257/396, 412, 413, 760, 763, 764, 754, 257/E21.006, E21.007, E21.027, E21.058, 257/E21.17, E21.231, E21.249, E21.259, 257/E21.267, E21.278, E21.293, E21.311, 257/E21.32, E21.545, E21.546, E21.547
See application file for complete search history.

(56) References Cited

U.S. PATENT DOCUMENTS 5,792,706 A * 8/1998 Michael et al. ............... 438/626
6,984,577 B1 * 1/2006 Zhao et al. ..................... 438/619
(Continued)

FOREIGN PATENT DOCUMENTS

| JP | 2010147410 A | 7/2010 |
|---|---|---|
| KR | 20100121884 A | 11/2010 |
| KR | 20110029228 A | 3/2011 |

*Primary Examiner* — David Nhu
(74) *Attorney, Agent, or Firm* — Harness, Dickey & Pierce

(57) ABSTRACT

In one embodiment, first and second pattern structures respectively include first and second conductive line patterns and first and second hard masks sequentially stacked, and at least portions thereof extends in a first direction. The insulation layer patterns contact end portions of the first and second pattern structures. The first pattern structure and a first insulation layer pattern of the insulation layer patterns form a first closed curve shape in plan view, and the second pattern structure and a second insulation layer pattern of the insulation layer patterns form a second closed curve shape in plan view. The insulating interlayer covers upper portions of the first and second pattern structures and the insulation layer patterns, a first air gap between the first and second pattern structures, and a second air gap between the insulation layer patterns.

16 Claims, 31 Drawing Sheets

(51) Int. Cl.
  *H01L 31/062* (2012.01)
  *H01L 31/113* (2006.01)
  *H01L 31/119* (2006.01)
  *H01L 21/033* (2006.01)
  *H01L 27/115* (2006.01)
  *H01L 21/764* (2006.01)
  *H01L 23/52* (2006.01)
  *H01L 21/768* (2006.01)
  *H01L 23/522* (2006.01)
  *H01L 23/532* (2006.01)
  *H01L 21/3213* (2006.01)

(56) References Cited

U.S. PATENT DOCUMENTS

| | | | |
|---|---|---|---|
| 7,078,814 B2 * | 7/2006 | Stamper | 257/760 |
| 7,544,602 B2 * | 6/2009 | Clevenger et al. | 438/619 |
| 8,618,679 B2 * | 12/2013 | Sim et al. | 257/786 |
| 8,642,470 B2 * | 2/2014 | Bao | 438/675 |
| 2010/0221904 A1 | 9/2010 | Brazzelli et al. | |
| 2010/0285662 A1 | 11/2010 | Kim et al. | |
| 2011/0062595 A1 | 3/2011 | Sim et al. | |
| 2011/0104891 A1 | 5/2011 | Al-Bayati et al. | |

* cited by examiner

CONDUCTIVE LINE STRUCTURES AND METHODS OF FORMING THE SAME

CROSS-REFERENCE TO RELATED APPLICATION

This application claims the benefit of priority under 35 USC §119 to Korean Patent Application No. 10-2012-0018073, filed on Feb. 22, 2012 in the Korean Intellectual Property Office (KIPO), the contents of which are herein incorporated by reference in their entirety.

BACKGROUND

1. Field

Example embodiments relate to conductive line structures and/or methods of forming the same. More particularly, example embodiments relate to conductive line structures of semiconductor devices and/or methods of forming the same.

2. Description of the Related Art

Forming minute conductive line patterns having a line width equal to, or less than, about 40 nm is not easy because of limitations of a photolithography process. Recently, minute conductive line patterns are formed by a double patterning process, or a quadruple patterning process. As the line width of the minute conductive line patterns decreases, the parasitic capacitance between the conductive line patterns increases.

SUMMARY

Example embodiments provide a conductive line structure having a reduced parasitic capacitance and a fast response time.

Example embodiments provide a method of forming a conductive line structure having a reduced parasitic capacitance and a fast response time.

According to example embodiments, there is provided a conductive line structure. The conductive line structure includes a first pattern structure, a second pattern, insulation layer patterns and an insulating interlayer. The first pattern structure includes a first conductive line pattern and a first hard mask sequentially stacked, and extends in a first direction. The second pattern structure includes a second conductive line pattern and a second hard mask sequentially stacked, and at least a portion of the second pattern structure extends in the first direction. The insulation layer patterns contact end portions of the first and second pattern structures. The first pattern structure and a first insulation layer pattern of the insulation layer patterns form a first closed curve shape in plan view, and the second pattern structure and a second insulation layer pattern of the insulation layer patterns form a second closed curve shape in plan view. The insulating interlayer covers upper portions of the first and second pattern structures and the insulation layer patterns, a first air gap between the first and second pattern structures, and a second air gap between the insulation layer patterns.

In example embodiments, the conductive line structure may further include a third pattern structure having a third conductive line pattern and a third hard mask sequentially stacked, and a fourth pattern structure having a fourth conductive line pattern and a fourth hard mask sequentially stacked. The first pattern structure, the first insulation layer pattern, the third pattern structure and a third insulation layer pattern of the insulation layer patterns may form the first closed curve shape. The second pattern structure, the second insulation layer pattern, the fourth pattern structure and a fourth insulation layer pattern of the insulation layer patterns may form the second closed curve shape. The first and second closed curve shapes may be parallel to each other.

In example embodiments, the first and second air gaps may be in fluid communication with each other to form a third closed curve shape in plan view.

In example embodiments, the first pattern structure, the first insulation layer pattern, the third pattern structure and a third insulation layer pattern of the insulation layer patterns may be sequentially arranged in the first closed curve shape.

In example embodiments, the insulation layer patterns may include at least one of silicon oxide and silicon nitride.

In example embodiments, the insulation layer patterns may include a material different from materials included in the first and second hard masks.

In example embodiments, the first and second conductive line patterns may include at least one selected from a metal, a metal nitride, a metal silicide and polysilicon.

In example embodiments, the conductive line structure may further include a pad on a lateral portion of each of the first and second pattern structures.

In example embodiments, the pad may have a stacked structure substantially the same as a stacked structure of the first pattern structure or a stacked structure of the second pattern structure.

In example embodiments, the first and second air gaps may have a width equal to, or less, than about 30 nm.

In example embodiments, the insulation layer patterns may be only between the first and second hard masks, and may have a material substantially the same as materials included in the first and second hard masks.

According to example embodiments, there is provided a method of forming a conductive line structure. In the method, a conductive line and a hard mask layer are sequentially formed on a substrate. Portions of the hard mask layer and the conductive line are removed to form an opening exposing a portion of the substrate. A preliminary insulation layer pattern is formed in the opening. The hard mask layer, the conductive layer and the preliminary insulation layer pattern are patterned to form a first pattern structure, a second pattern structure and an insulation layer patterns. The first pattern structure includes a first conductive line pattern and a first hard mask sequentially stacked and extends in a first direction. The second pattern structure includes a second conductive line pattern and a second hard mask sequentially stacked, and at least a portion of the second pattern structure extends in the first direction. The insulation layer patterns contact end portions of the first and second pattern structures. The first pattern structure and a first insulation layer pattern of the insulation layer patterns form a first closed curve shape in plan view, and the second pattern structure and a second insulation layer pattern of the insulation layer patterns form a second closed curve shape in plan view. An insulating interlayer is formed to cover upper portions of the first and second pattern structures and the insulation layer patterns, a first air gap between the first and second pattern structures, and a second air gap between the insulation layer patterns.

In example embodiments, when the preliminary insulation layer pattern is formed, an insulation layer may be formed on the exposed portion of the substrate and the hard mask layer to fill the opening, and the insulation layer may be planarized until a top surface of the hard mask layer is exposed.

In example embodiments, a mask having a third closed curve shape in plan view may be further formed on the hard mask layer, the conductive layer and the preliminary insulation layer pattern.

In example embodiments, when the mask is formed, a temporary mask layer may be formed on the hard mask layer, the conductive layer and the preliminary insulation layer pattern, an etching mask having a fourth closed curve shape in plan view may be formed on the temporary mask layer, and the mask layer may be etched using the etching mask.

According to example embodiments, there is provided a conductive line structure including a bilayer structure. The bilayer structure includes a double-walled pattern and insulation layer patterns. The double-walled pattern has first and second wall patterns each with respective ends adjoined to each other via one of the insulation layer patterns so as to form a closed loop in plan view. The first and second wall patterns are separated from each other by a first gap containing a first gas. At least one the first and second wall patterns include two walls partially separated from each other by a second gap containing a second gas.

In example embodiments, at least one of the first and second gases may be air.

In example embodiments, the first and second wall patterns may each include two walls partially separated from each other by a gap containing a gas. The first and second wall patterns may be arranged symmetrically with reference to a line extending between the first and second wall patterns.

In example embodiments, the conductive line structure may further include at least one pad contacting a sidewall of at least one of the first and second wall patterns.

In example embodiments, a distance between the first wall pattern and the second wall pattern is consistent.

In example embodiments, the closed loop formed by the second wall pattern is within the closed loop formed by the first wall pattern.

According to example embodiments, a line pattern structure having a continuous air gap between minute conductive patterns may be formed. Thus, a parasitic capacitance, a coupling and an RC delay may be reduced. The minute conductive patterns may serve as control gates of a NAND flash memory device, and in this case, the NAND flash memory device may have a high integration degree and good characteristics.

BRIEF DESCRIPTION OF THE DRAWINGS

Example embodiments will be more clearly understood from the following detailed description taken in conjunction with the accompanying drawings. FIGS. 1 to 16 represent non-limiting, example embodiments as described herein.

FIG. 4 is a plan view illustrating a stacked structure in accordance with a modified example embodiment;

FIG. 11 is a cross-sectional view illustrating a NAND flash memory device in accordance with a further example embodiment;

FIG. 16 is a NAND flash memory device in accordance with still another example embodiment;

DESCRIPTION OF EXAMPLE EMBODIMENTS

Figure 1A:
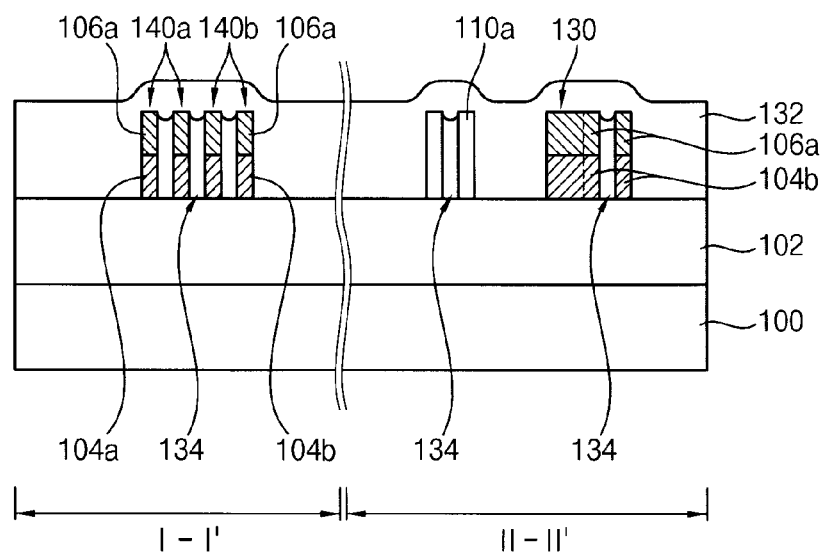
FIG. 1A is a cross-sectional view illustrating a conductive line structure in accordance with an example embodiment.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being various elements, these elements should not be limited by these terms. These terms are only used to distinguish one element from another. For example, a first element could be termed as being "directly connected" or "directly coupled" to another element, there are no intervening elements present. Other words used to describe the relationship between elements should be interpreted in a like fashion ("between" versus "directly between," "adjacent" versus "directly adjacent," etc.).

The terminology used herein is for the purpose of describing particular embodiments only and is not intended to be limiting of example embodiments. As used herein, the singular forms one element from an" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to conductive line structures and/or methods of forming the same. More particularly, example embodiments relate to conductive line structures of semiconductor devices and/or methods of forming the same.

Figure 1B:
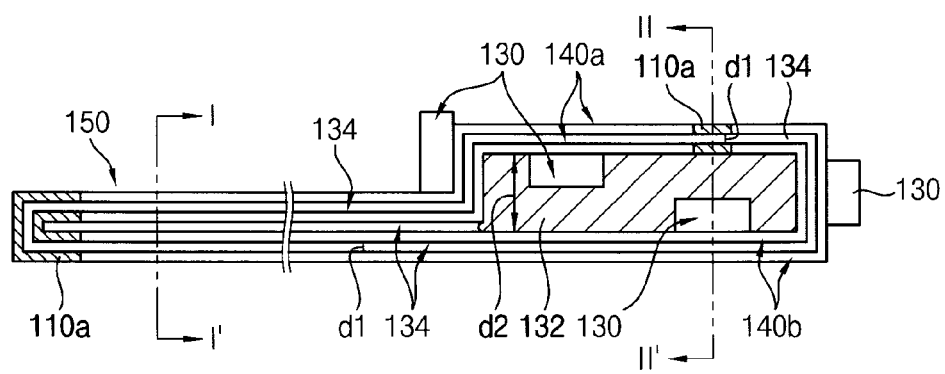
FIG. 1B is a plan view of the conductive line structure of FIG. 1A.
Figure 1C:
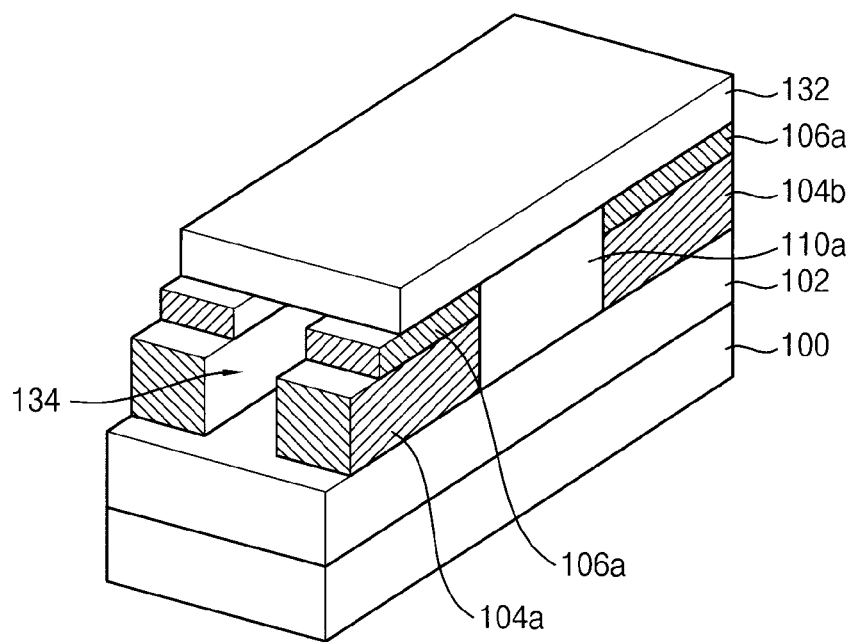
FIG. 1C is a perspective view of a region of the conductive line structure of FIGS. 1A and 1B.

FIG. 1A is a cross-sectional view illustrating a conductive line structure in accordance with an example embodiment, FIG. 1B is a plan view of the conductive line structure of FIG. 1A, and FIG. 1C is a perspective view of a region of the conductive line structure of FIGS. 1A and 1B. Particularly, FIG. 1A is a cross-sectional view cut along the lines I-I' and II-II' in FIG. 1B.

Referring to FIGS. 1A, 1B and 1C, a substrate 100 may include a lower structure (not shown) thereon. The lower structure may include transistors, lower wirings, etc. A lower insulating interlayer 102 covering the lower structure may be formed on the substrate 100.

A stacked structure 150 having a closed curve shape when viewed from a top side may be formed on the lower insulating interlayer 102. In example embodiments, a plurality of stacked structures 150 may be formed. For example, two stacked structures 150 are shown in FIG. 1B.

The stacked structure 150 may include a first pattern structure 140a, a second pattern structure 140b and an insulation layer pattern 110a. The insulation layer pattern 110a may be formed between the first and second pattern structures 140a and 140b and make contact with end portions of the first and second pattern structures 140a and 140b.

The first pattern structure 140a may have a first line pattern 104a and a first hard mask 106a sequentially stacked on the lower insulating interlayer 102, and the second pattern structure 140b may have a second line pattern 104b and the first hard mask 106a sequentially stacked on the lower insulating interlayer 102. The first and second line patterns 104a and 104b may include substantially the same conductive material. For example, the first and second line structures 104a and 104b may include a metal, a metal nitride, polysilicon, etc.

The insulation layer pattern 110a may include an insulating material different from that of the first hard mask 106a. For example, the insulation layer pattern 110a may include silicon oxide and/or silicon nitride.

Top surfaces of the first and second pattern structures 140a and 140b may be coplanar with that of the insulation layer pattern 110a.

The first and second line patterns 104a and 104b may be parallel to each other, and may serve as separated wirings. The insulation layer pattern 110a may be placed at a position at which the first and second line patterns 104a and 104b are not formed. For example, the insulation layer pattern 110a may make contact with end portions of the first and second pattern structures 140a and 140b along a first direction in which the first and second pattern structures 140a and 140b extend.

A lateral portion of each of the first and second line patterns 104a and 104b may be electrically connected to a pad 130. The pad 130 may have a stacked structure substantially the same as that of the first pattern structure 140a or the second pattern structure 140b.

At least a portion of the first pattern structure 140a or the second pattern structure 140b may be bent so that a space for forming the pad 130 may be provided.

The first and second pattern structures 140a and 140b may be spaced apart from each other along a second direction substantially perpendicular to the first direction at a first distance d1 in a first region and at a second distance d2 greater than the first distance d1 in a second region. In example embodiments, a plurality of first pattern structures 140a, a plurality of second pattern structures 140b, and a plurality of insulation layer patterns 110a may be formed, and in this case, the first pattern structures 140a may be spaced apart from each other by the first distance d1 in the second direction, the second pattern structures 140b may be spaced apart from each other by the first distance d1 in the second direction, and the insulation layer patterns 110a may be spaced apart from each other by the first distance d1 in the second direction.

As shown in FIG. 1B, a plurality of stacked structures 150 having a closed curve shape may be arranged so that the stacked structures 150 may be substantially parallel to each other.

The first distance d1 may be equal to, or less than, a limit line width of a photolithography process. For example, the first distance d1 may be equal to, or less than, about 30 nm.

An insulating interlayer 132 may partially cover the stacked structure 150. The insulating interlayer 132 may be formed on upper portions of the first hard mask 106a and the insulation layer pattern 110a.

The insulating interlayer 132 may not fill spaces between the first line patterns 104a or between the second line patterns 104b. Additionally, the insulating interlayer 132 may not fill a space between the first and second line patterns 104a and 104b in the first region. The insulating interlayer 132 may cover a top surface and an upper sidewall of the first hard mask 106a. The space that is not filled with the insulating interlayer 132 may be referred to as a first air gap 134. Due to the first air gap 134 between the first and second line patterns 104a and 104b, the parasitic capacitance therebetween may be reduced. Accordingly, an RC delay may be reduced and a break-down may be prevented.

The stacked structure 150 may have the closed curve shape, and thus the first air gap 134 between the stacked structures 150 may be continuously formed.

An air gap is typically not be formed between a plurality of conductive lines that are physically separated from each other because it is difficult to fill an insulating interlayer therebetween (i.e., the air gap may not be continuously formed). However, in accordance with example embodiments, the first air gap 134 may be continuously formed between the first and second line patterns 104a and 104b.

FIGS. 2A to 2I are cross-sectional views illustrating a method of manufacturing the conductive line structure of FIGS. 1A to 1C in accordance with an example embodiment, and FIGS. 3A to 3G are plan views illustrating the method of manufacturing the conductive line structure. Particularly, FIGS. 2A to 2H are cross-sectional views cut along the lines I-I' and II-II' in FIG. 1B.

Figure 2A:
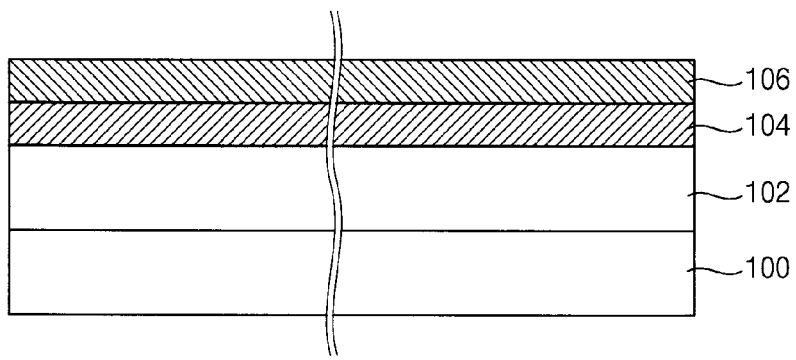
FIGS. 2A to 2I are cross-sectional views illustrating a method of manufacturing the conductive line structure of FIGS. 1A to 1C in accordance with an example embodiment.

Referring to FIG. 2A, a lower structure (not shown) may be formed on a substrate 100, and a lower insulating interlayer 102 may be formed on the substrate 100 to cover the lower structure.

A conductive layer 104 may be formed on the lower insulating interlayer 102. The conductive layer 104 may be formed to include a metal, a metal silicide, a metal nitride, polysilicon, etc. In an example embodiment, the conductive layer 104 may be formed to have a stacked structure including a barrier layer and a metal layer. For example, the barrier layer may be formed to include titanium, titanium nitride, tantalum, tantalum nitride, etc., and the metal layer may be formed to include tungsten.

A first hard mask layer 106 may be formed on the conductive layer 104 to include an insulating material. For example, the first hard mask layer 106 may be formed to include silicon nitride.

Figure 2B:
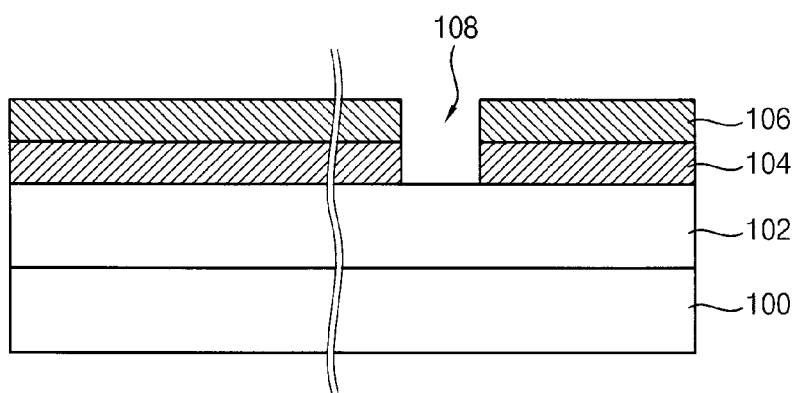
Figure 3A:
FIGS. 3A to 3G are plan views illustrating the method of manufacturing the conductive line structure.

Referring to FIGS. 2B and 3A, a photoresist layer (not shown) may be formed on the first hard mask layer 106. The photoresist layer may be patterned to form a photoresist pattern (not shown).

The first hard mask layer 106 and the conductive layer 104 may be etched using the photoresist pattern as an etching mask to form an opening 108 exposing a portion of the insulating interlayer 102.

The photoresist pattern may be removed by an ashing process and/or a stripping process.

Figure 2C:
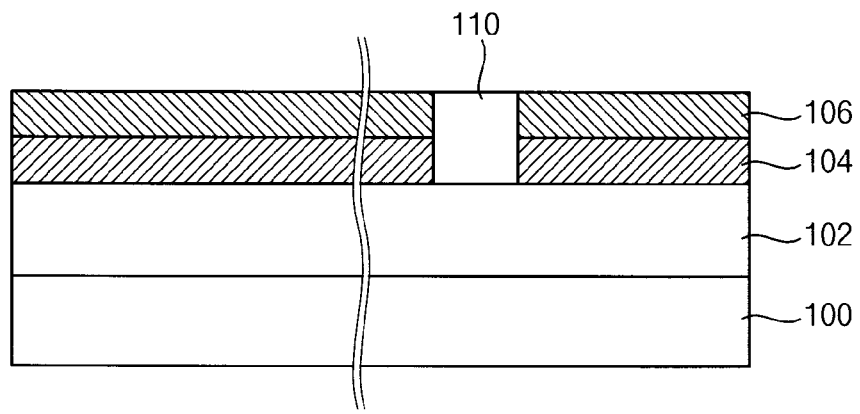
Figure 3B:

Referring to FIGS. 2C and 3B, an insulation layer may be formed to sufficiently fill the opening 108. The insulation layer may be formed to include (e.g., silicon oxide or silicon nitride). The insulation layer may be formed to include a material different from that of the first hard mask layer 106 (e.g., a material having an etch selectivity with respect to the first hard mask layer 106). In an example embodiment, the insulation layer may be formed to include silicon oxide.

The insulation layer may be planarized until a top surface of the first hard mask layer 106 may be exposed to form a preliminary insulation layer pattern 110 in the opening 108.

A layer including a material substantially the same as that of the first hard mask layer 106 (e.g., silicon nitride) may be further formed on the first hard mask layer 106 and the preliminary insulation layer pattern 110. In this case, the layer may compensate for the thickness of the first hard mask layer 106 that may become thinner during the planarization process, and the preliminary insulation layer pattern 110 may have a multi-layered structure including silicon oxide and silicon nitride.

Figure 2D:
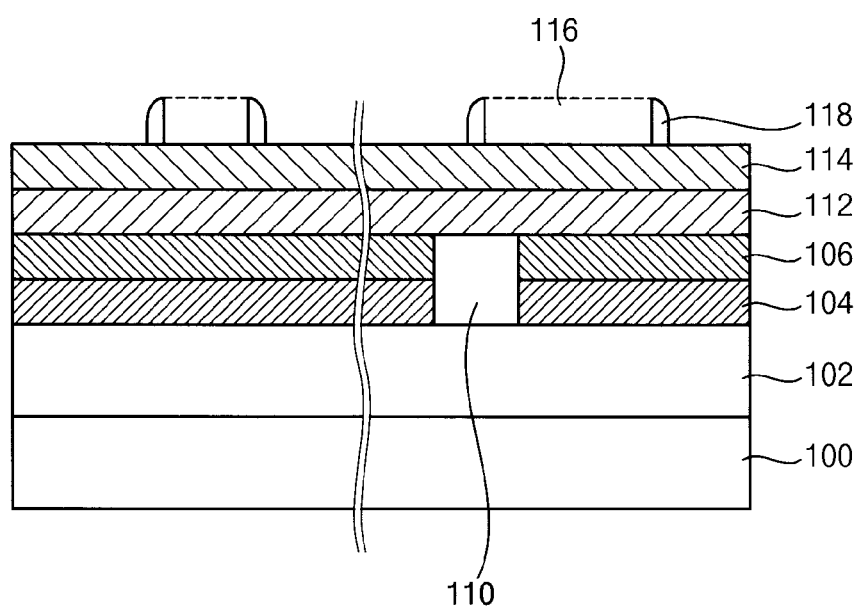
Figure 3C:
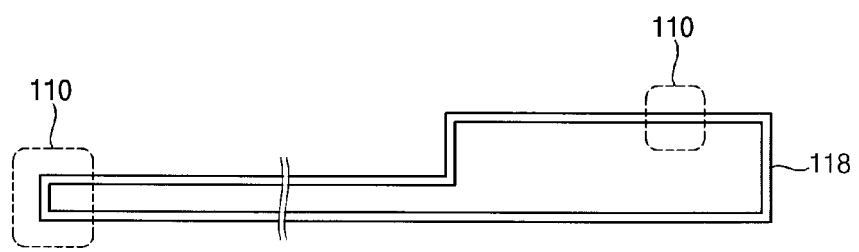

Referring to FIGS. 2D and 3C, a second hard mask layer 112 may be formed on the preliminary insulation layer pattern 110 and the first hard mask layer 106. For example, the second hard mask layer 112 may be formed to include polysilicon.

A first temporary mask layer 114 may be formed on the second hard mask layer 112. In example embodiments, an amorphous carbon layer may be formed as the first temporary mask layer 114. A silicon oxynitride layer (not shown) serving as an anti-reflection layer may be further formed on the first temporary mask layer 114.

A second temporary mask layer (not shown) may be formed on the silicon oxynitride layer. The second temporary mask layer may be formed to include a material that may be easily removed by an ashing process and/or a stripping process (e.g., a polymer). For example, the second temporary mask layer may be formed to include silicon-based spin-on-hard mask (Si-SOH) or carbon-based spin-on-hard mask (C-SOH).

A photoresist pattern may be formed on the second temporary mask layer, and the second temporary mask layer may be patterned using the photoresist pattern as an etching mask to form a second temporary mask 116.

A first spacer layer may be formed on the second temporary mask 116 and the first temporary mask layer 114. The spacer layer may be formed to include silicon oxide, e.g., by performing an atomic layer deposition (ALD) process.

The first spacer layer may be anisotropically etched to form a first spacer 118 on sidewalls of the second temporary mask 116. In example embodiments, two first spacers 118, each of which may have a closed curve shape on the sidewall of the second temporary mask 116, may be formed.

The second temporary mask 116 may be removed so that only the first spacer 118 may remain on the first temporary mask layer 114. The second temporary mask 116 may be removed by an ashing process and/or a stripping process.

Figure 2E:
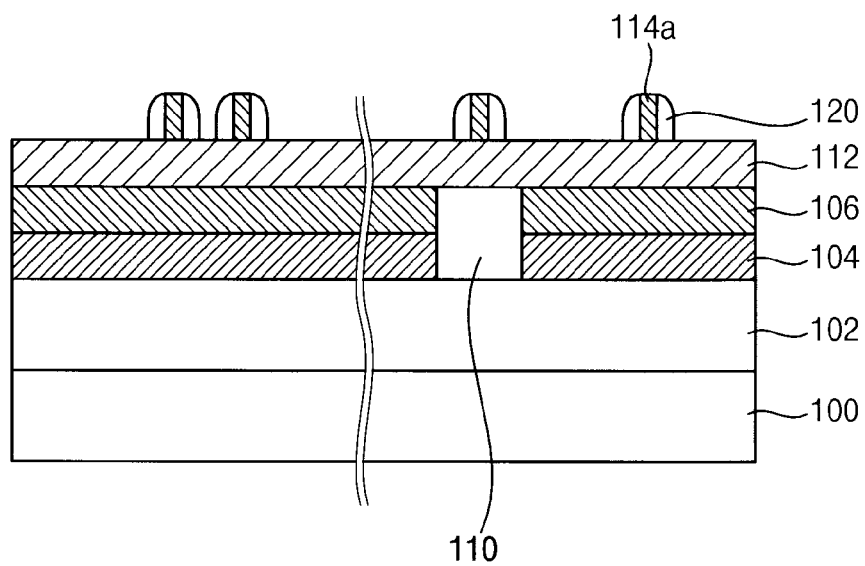
Figure 3D:
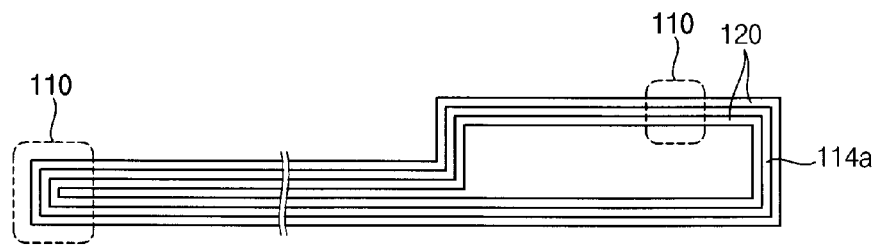

Referring to FIGS. 2E and 3D, the first temporary mask layer 114 may be etched using the first spacer 118 as an etching mask to form a first temporary mask 114a on the second hard mask layer 112. The first spacer 118 may be removed.

A second spacer layer (not shown) may be formed on the first temporary mask 114a and the second hard mask layer 112. The second spacer layer may be formed to include silicon oxide (e.g., by an ALD process). The second spacer layer may be formed to have a width substantially the same as that of a desired line pattern.

The second spacer layer may be anisotropically etched to form a second spacer 120. The second spacer 120 may be formed on sidewalls of the first temporary mask 114a and extend in a first direction.

Figure 2F:
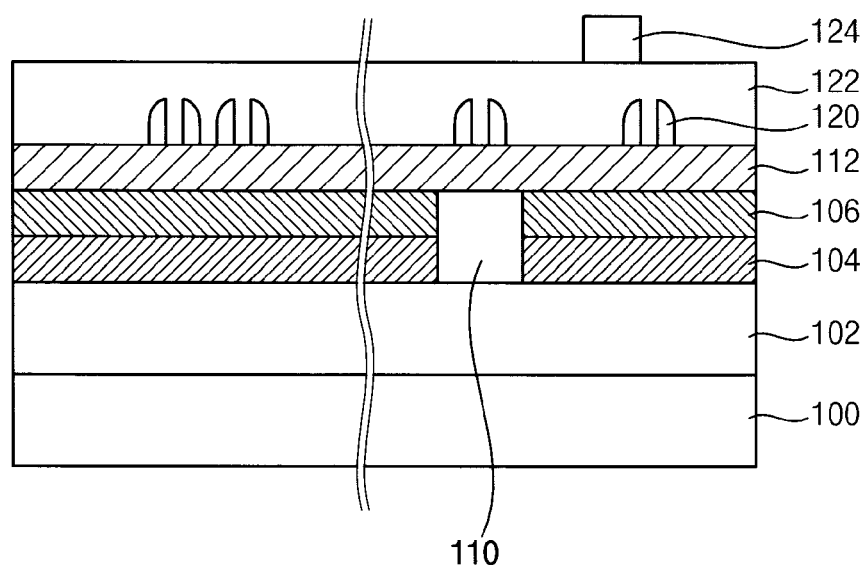
Figure 3E:
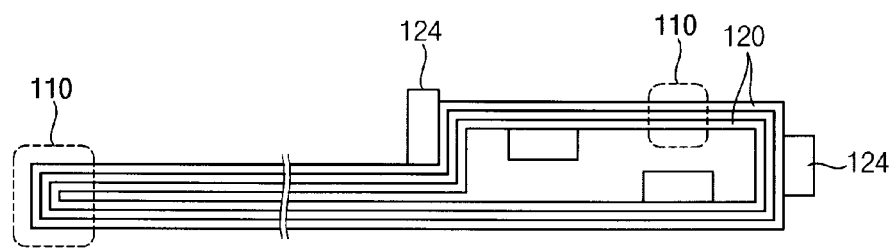

Referring to FIGS. 2F and 3E, the first temporary mask 114a between the second spacers 120 may be removed. Thus, two second spacers 120 that are spaced apart from and substantially parallel to each other may be formed. Each of the second spacers 120 may have a closed curve shape, and the two closed curves may be substantially parallel to each other. A trimming process in which the second spacer 120 may be etched to be divided into a plurality of line segment may not be performed.

A sacrificial layer 122 may be formed on the second hard mask layer 112 to sufficiently cover the second spacer 120. The sacrificial layer 122 may be formed to include, e.g., spin-on-hard mask (SOH). A photoresist pattern 124 may be formed on the sacrificial layer 122. The photoresist pattern 124 may serve as an etching mask for forming a pad 130 (refer to FIG. 3F) in a subsequent process.

Figure 2G:
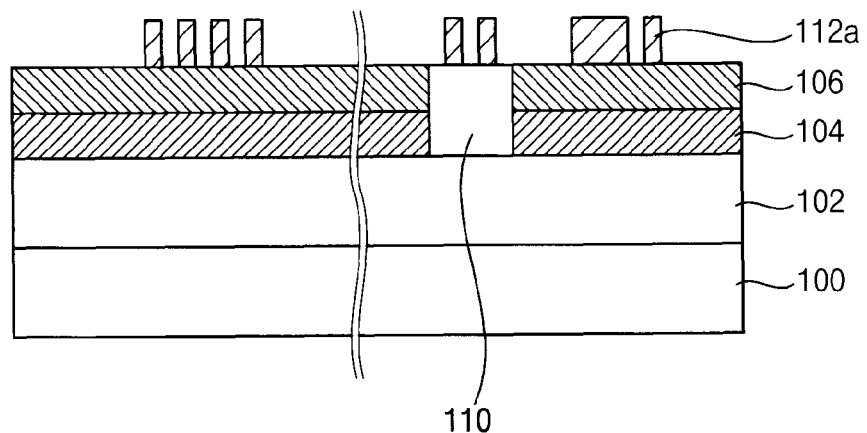

Referring to FIG. 2G, the sacrificial layer 122 may be etched using the photoresist pattern 124 as an etching mask. Additionally, the second hard mask layer 112 may be etched using the second spacer 120 and the photoresist pattern 124 as an etching mask to form a second hard mask 112a on the first hard mask layer 106 and the preliminary insulation layer pattern 110.

In example embodiments, two second hard masks 112a may be formed to be parallel to each other, and each of the second hard masks 112a may have a closed curve shape. A portion of the second hard mask 112a may overlap with the preliminary insulation layer pattern 110.

Figure 2H:
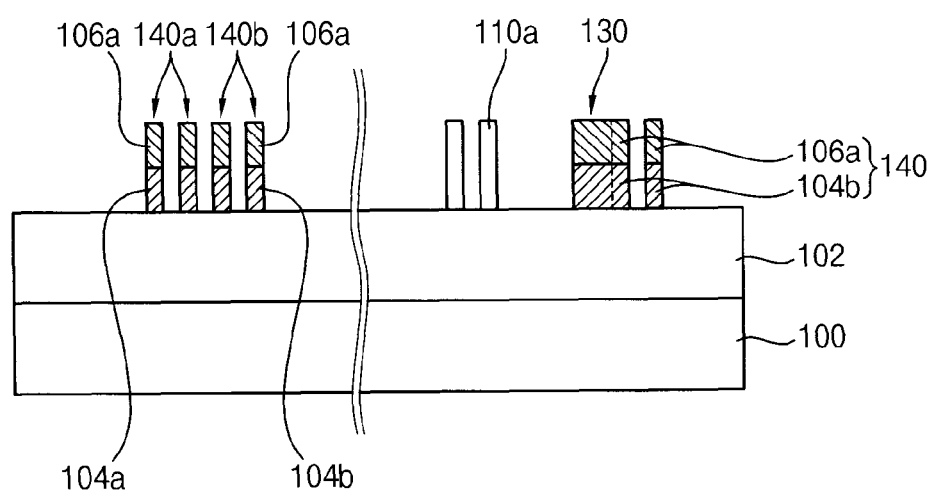
Figure 3F:
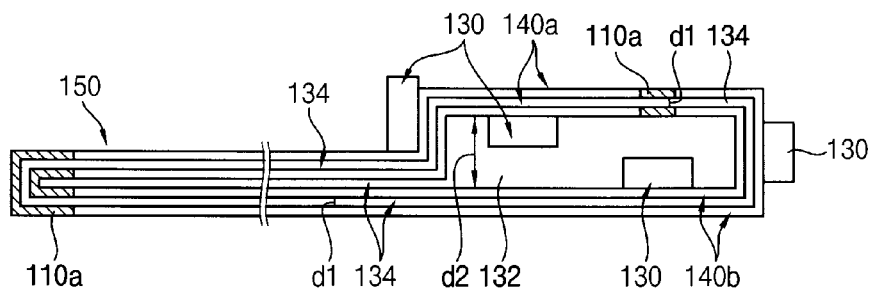

Referring to FIGS. 2H and 3F, the first hard mask layer 106, the conductive layer 104 and the preliminary insulation layer pattern 110 may be etched using the second hard mask 112a as an etching mask. After the etching process, most of the second hard mask 112a may be removed. Thus, a stacked structure 150 having a closed curve shape may be formed.

The stacked structure 150 may include a first pattern structure 140a, a second pattern structure 140b and an insulation layer pattern 110a. A first line pattern 104a in the first pattern structure 140a and a second line pattern 104b in the second pattern structure 140b may be insulated from each other by the insulation layer pattern 110a and serve as independent conductive lines.

After performing the etching process, the pad 130 may be formed to make contact with a lateral portion of each of the first and second pattern structures 140a and 140b. The first and second pattern structures 140a and 140b may be spaced apart from each other by a first distance d1 in a first region and by a second distance d2 greater than the first distance d1 in a second region. Additionally, the first pattern structures 140a may be spaced apart from each other by the first distance d1 in a second direction substantially perpendicular to the first direction, the second pattern structures 140b may be spaced apart from each other by the first distance d1 in the second direction, and the insulation layer patterns 110a may be spaced apart from each other by the first distance d1 in the second direction.

Figure 2I:
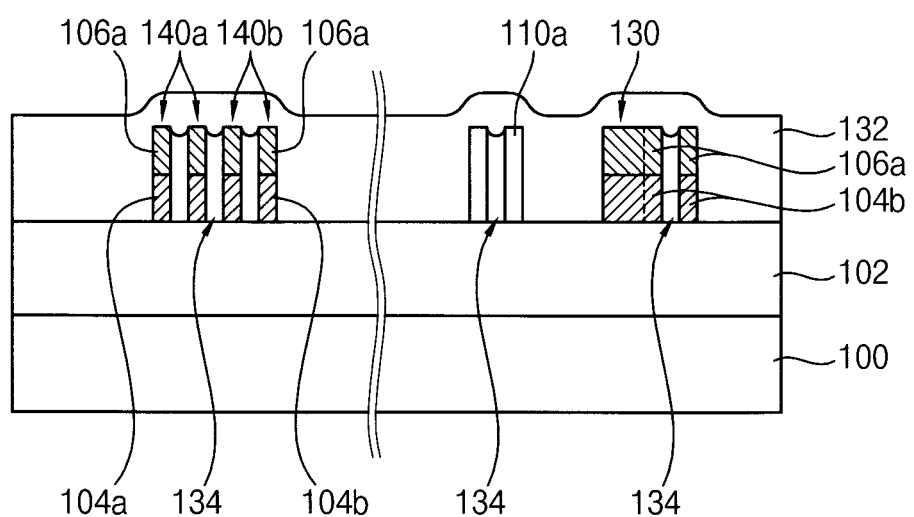
Figure 3G:
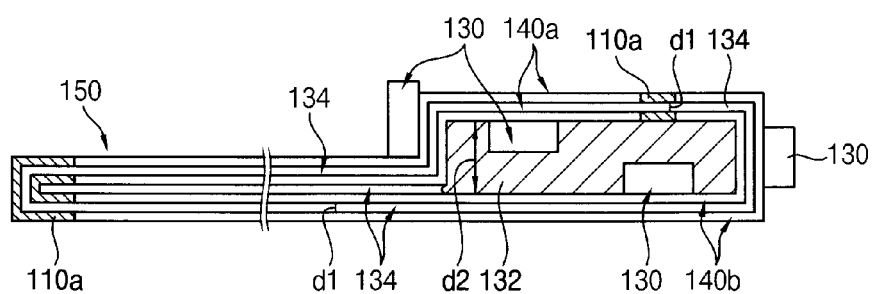

Referring to FIGS. 2I and 3G, an insulating interlayer 132 may be formed on the lower insulating interlayer 102 to cover the stacked structure 150. The insulating interlayer 132 may be formed to include, e.g., silicon oxide.

The insulating interlayer 132 may not completely fill a space between the first and second pattern structures 140a and 140b in the first region, a space between the first pattern structures 140a, a space between the second pattern structures 140b, or a space between the insulation layer patterns 110a. However, the insulating interlayer 132 may sufficiently fill a space between the first and second pattern structures 140a and 140b in the second region. The insulating interlayer 132 may cover a top surface of the stacked structure 150.

The spaces that are not completely filled with the insulating interlayer 132 may be referred to as a first air gap 134, which may be continuously formed therein. The parasitic capacitance between the first and second line patterns 104a and 104b may be reduced.

The stacked structure 150 may be formed by a quadruple patterning technology (QPT), and thus two stacked structures 150 having a closed curve shape may be formed. Alternatively, the stacked structure 150 may be formed by a double patterning technology (DPT), which may be illustrated hereinafter.

Figure 4:
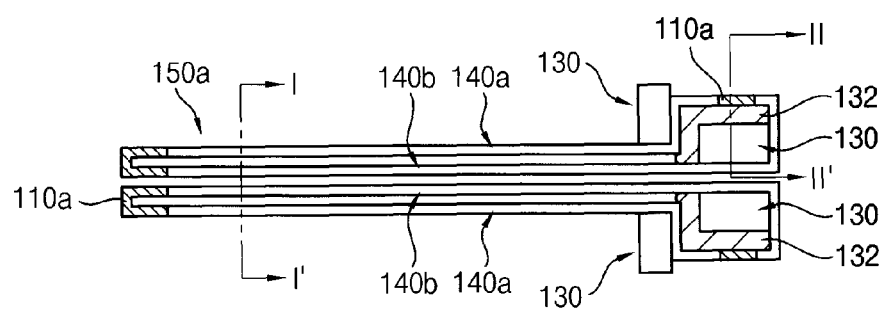

FIG. 4 is a plan view illustrating a stacked structure in accordance with a modified example embodiment.

Referring to FIG. 4 two stacked structures 150a, each of which may have a closed curve shape, may be formed separately. In an example embodiment, the two stacked structures 150a may be arranged axisymmetrically with reference to a line extending in a first direction. The stacked structure 150a may have the first and second pattern structures 140a and 140b and the insulation layer pattern 132 like the stacked structure 150 in FIGS. 1A to 1C. That is, the cross-sectional view of the stacked structure 150a may be substantially the same as that of the stacked structure 150 of FIG. 1A.

Hereinafter, a method of forming a conductive line structure will be illustrated. The method of forming the conductive line structure may be substantially the same as or similar to that illustrated with reference to FIGS. 2A to 2I and 3A to 3G, except that the method is performed by a double patterning process during the formation of the second hard mask.

Figure 5A:
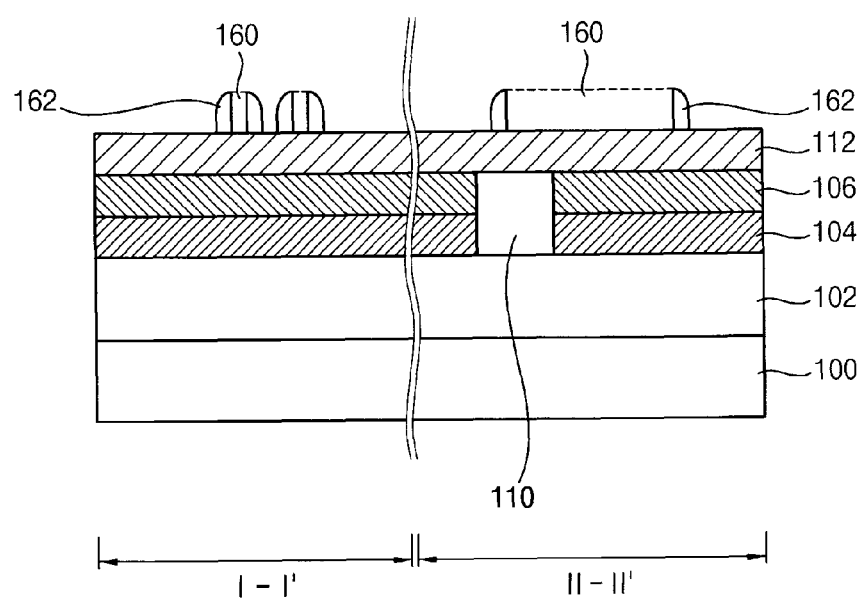
FIGS. 5A to 5C are cross-sectional views illustrating a method of manufacturing the conductive line structure of FIG. 4 in accordance with another example embodiment.
Figure 5B:
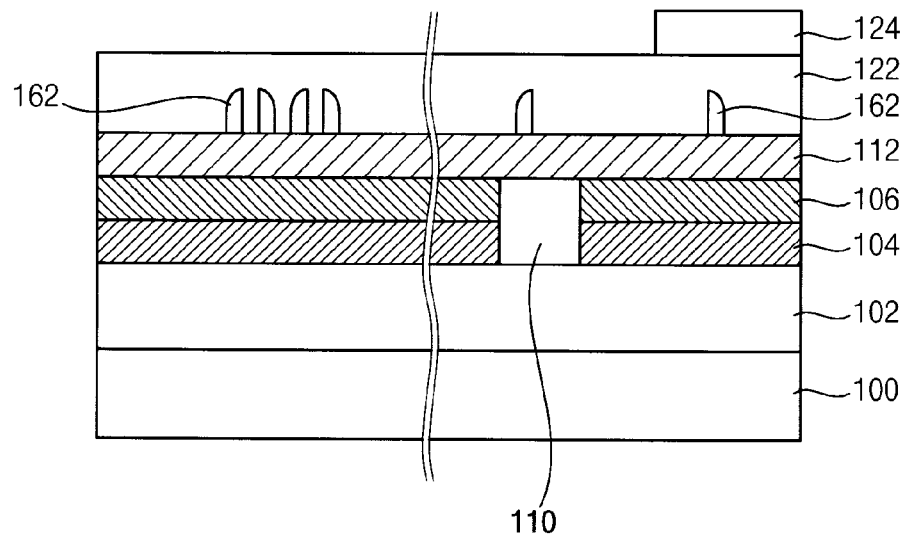
Figure 5C:
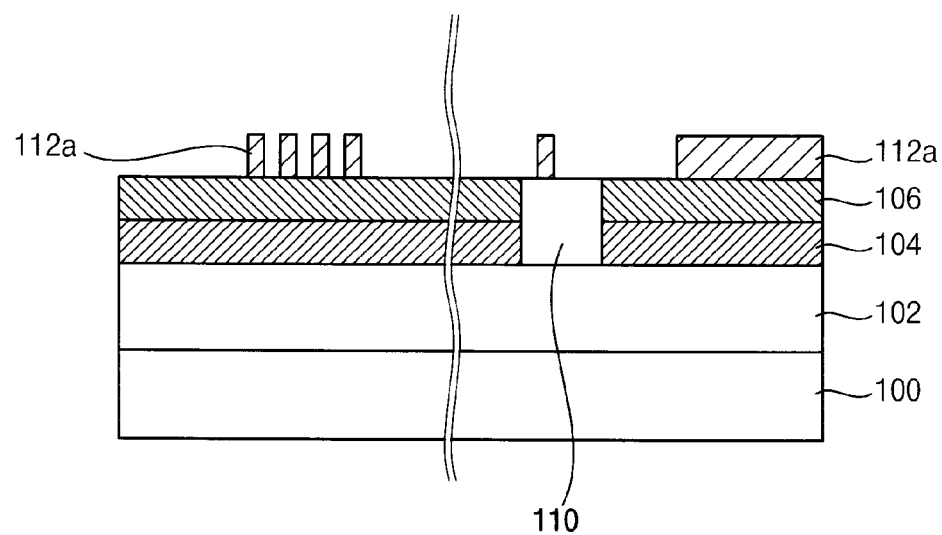

FIGS. 5A to 5C are cross-sectional views illustrating a method of manufacturing the conductive line structure of FIG. 4 in accordance with another example embodiment. Particularly, FIGS. 5A to 5C are cross-sectional views cut along the lines I-I' and II-II' in FIG. 4.

First, processes substantially the same as or similar to those illustrated with reference to FIGS. 1A to 1C may be performed.

Referring to FIG. 5A, a second hard mask layer 112 may be formed on the first hard mask layer 106 and the preliminary insulation layer pattern 110. For example, the second hard mask layer 112 may be formed to include polysilicon.

A first temporary mask layer (not shown) may be formed on the second hard mask layer 112. The first temporary mask layer may be formed to include amorphous carbon. A silicon oxynitride layer (not shown) serving as an anti-reflection layer may be further formed on the first temporary mask layer.

The first temporary mask layer may be patterned to form a first temporary mask 160.

A first spacer layer (not shown) may be formed on the second hard mask layer 112 to cover the first temporary mask 160. The first spacer layer may be formed to include, e.g., silicon nitride. The first spacer layer may be formed by, e.g., an ALD process.

The first spacer layer may be anisotropically etched to form a first spacer 162 on sidewalls of the first temporary mask 160. In example embodiments, two first spacers 162, each of which may have a closed curve shape on the sidewall of the first temporary mask 160, may be formed.

Referring to FIG. 5B, a sacrificial layer 122 may be formed on the second hard mask layer 112 to sufficiently cover the first spacer 162. The sacrificial layer 122 may be formed to include spin-on-hard mask. A photoresist pattern 124 may be formed on the sacrificial layer 122. The photoresist pattern 124 may serve as an etching mask for forming a pad.

Referring to FIG. 5C, the sacrificial layer 122 may be etched using the photoresist pattern 124 as an etching mask, and the second hard mask layer 112 may be etched using the first spacer 162 and the photoresist pattern 124 as an etching mask to form a second hard mask 112a.

As illustrated above, the second hard mask 112a may be formed by a double patterning process. Thus, two second hard masks 112a, each of which may have a closed curve shape, may be formed separately. The second hard mask 112a may overlap the preliminary insulation layer pattern 110.

Processes substantially the same as or similar to those illustrated with reference to FIGS. 2H to 2I may be performed to form the conductive line structure of FIG. 4.

The above conductive line structure may be applied to various types of semiconductor devices. For example, the conductive line structure may be applied to NAND flash memory devices. Hereinafter, a NAND flash memory device including the above conductive line structure and a method of manufacturing the same may be illustrated.

Figure 6A:
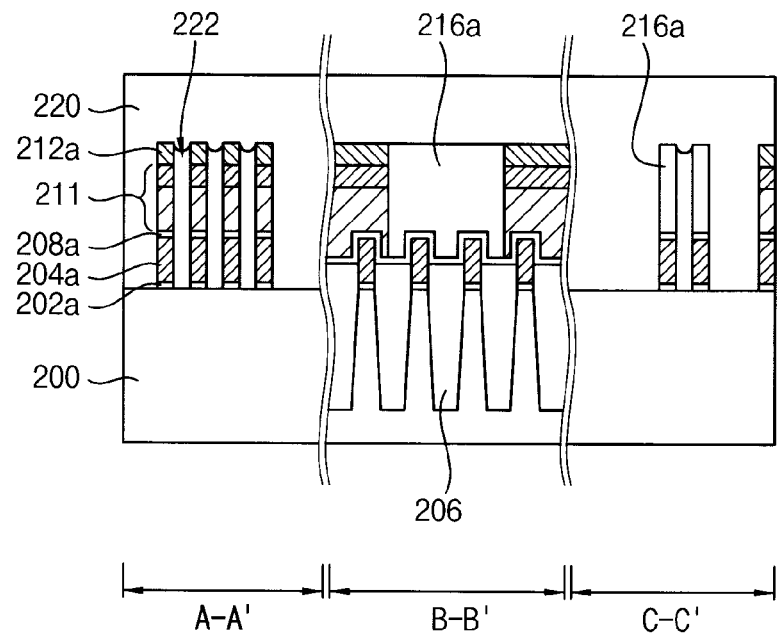
FIG. 6A is a cross-sectional view illustrating a NAND flash memory device in accordance with an example embodiment.
Figure 6B:
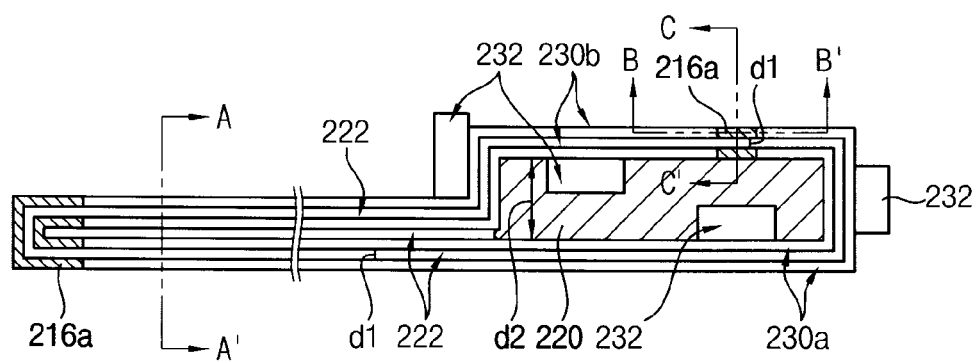
FIG. 6B is a plan view of the NAND flash memory device of FIG. 6A.

FIG. 6A is a cross-sectional view illustrating a NAND flash memory device in accordance with an example embodiment, and FIG. 6B is a plan view of the NAND flash memory device of FIG. 6A.

Word lines of the NAND flash memory device may correspond to the conductive line structure of FIGS. 1A to 1C.

FIG. 6A is a cross-sectional view cut along the lines A-A', B-B' and C-C' of FIG. 6B.

Referring to FIGS. 6A and 6B, a substrate 200 may include a field region and an active region. In example embodiments, a plurality of active regions each of which may extend in a first direction may be formed in a second direction substantially perpendicular to the first direction. Isolation layer patterns 206 including an insulating material may be formed between the active regions.

Cell strings may be formed in a cell region of the substrate 200. Each cell string may include cell transistors, a string selection transistor (SST) and a ground selection transistor (GST). In example embodiments, the cell transistors may be formed at a central portion of each cell string, and the SST and the GST may be formed, e.g., at rightmost and leftmost portions of each cell string, respectively.

An impurity region (not shown) adjacent to the SST may be electrically connected to a bit line (not shown), and an impurity region (not shown) adjacent to the GST may be electrically connected to a common source line (CSL) (not shown). The CSL may extend in the second direction and electrically connect the plurality of cell strings.

Each cell transistor may include a tunnel insulation layer pattern 202a, a charge storage layer pattern 204a, a blocking layer pattern 208a, a gate electrode 211 and a hard mask pattern 212a sequentially stacked on the substrate 200.

Particularly, the tunnel insulation layer pattern 202a may be formed on the active region. A plurality of charge storage layer patterns 204a having an island shape may be formed on the tunnel insulation layer pattern 202a. The charge storage layer pattern 204a may be a floating gate including, e.g., doped polysilicon, or a charge trapping layer pattern including, e.g., silicon nitride. The gate electrode 211 may serve as a word line.

A stacked structure of the gate electrode 211, the hard mask pattern 212a and the insulation layer pattern 216a may correspond to the stacked structure 150 of FIGS. 1A to 1C.

Particularly, the gate electrode 211 and the hard mask pattern 212a of the stacked structure may correspond to the line patterns 104a and 104b and the first hard mask 106a of the stacked structure 150, and the insulation layer pattern 216a of the stacked structure may correspond to the insulation layer pattern 110a of the stacked structure 150. The gate electrode 211 and the hard mask pattern 212a may form a first pattern structure 230a and a second pattern structure 230b according to the position thereof. The gate electrode 211 having a closed curve shape may be divided into two by the insulation layer pattern 216a, may serve as two independent word lines. Thus, the gate electrode 211 and the insulation layer pattern 216a may form a closed curve.

At least a portion of the first pattern structure 230a or the second pattern structure 230b may be bent.

As shown in FIG. 6B, in an example embodiment, two stacked structures may be formed to be parallel to each other. Alternatively, two stacked structures may be formed to be separate from each other and axisymmetrical with a reference line extending in the first direction.

The gate electrode 211 may include a conductive material. For example, the gate electrode 211 may include doped polysilicon, a metal, a metal silicide, etc. In the present example embodiment, the gate electrode 211 may include a doped polysilicon layer and a tungsten layer sequentially stacked.

Beneath the insulation layer pattern 216a, the tunnel insulation layer pattern 202a, the charge storage layer pattern 204a, and the blocking layer pattern 208a may be sequentially stacked.

The SST and the GST may include a stacked structure having a width greater than that of a stacked structure of the cell transistors.

A lateral portion of each of the first and second line patterns 230a and 230b may be electrically connected to a pad 232.

An insulating interlayer 220 covering the stacked structure may be formed on the substrate 200.

The insulating interlayer 220 may not completely fill a space between the first and second pattern structures 230a and 230b in a first region in which the first and second pattern structures 230a and 230b may be spaced apart from each other by a first distance d1, a space between the first pattern structures 230a, a space between the second pattern structures 230b, or a space between the insulation layer patterns 216a. However, the insulating interlayer 220 may sufficiently fill a space between the first and second pattern structures 230a and 230b in a second region in which the first and second pattern structures 230a and 230b may be spaced apart from each other at a second distance d2 greater that the first distance d1. The insulating interlayer 220 may cover a top surface of the stacked structure. The space that is not filled with the insulating interlayer 220 may be referred to as an air gap 222. The stacked structure may have the closed curve shape, and thus the air gap 222 between the stacked structures may be continuously formed.

Hereinafter, a method of manufacturing the NAND flash memory device of FIGS. 6A and 6B in accordance with example embodiments may be illustrated.

FIGS. 7A to 7E are cross-sectional views illustrating a method of manufacturing the NAND flash memory device of FIGS. 6A and 6B. Particularly, FIGS. 7A to 7E are cross-sectional views cut along the lines A-A', B-B' and C-C' of FIG. 6B.

Figure 7A:
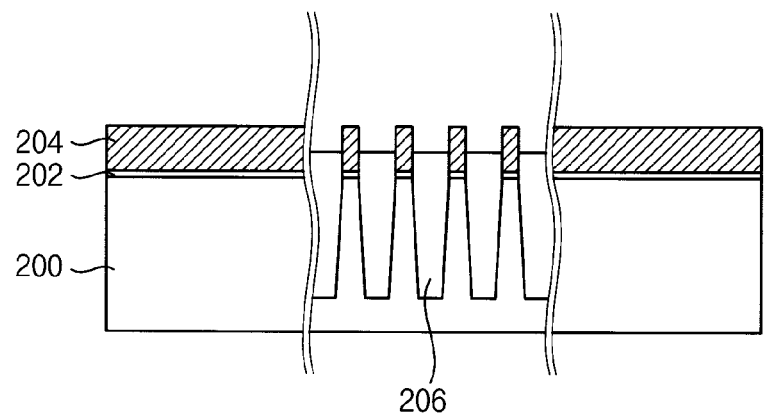
FIGS. 7A to 7E are cross-sectional views illustrating a method of manufacturing the NAND flash memory device of FIGS. 6A and 6B.

Referring to FIG. 7A, a tunnel insulation layer 202 may be formed on a substrate 200. In example embodiments, the tunnel insulation layer 202 may be formed by a thermal oxidation process on a top surface of the substrate 200. A charge storage layer 204 may be formed on the tunnel insulation layer 202. In an example embodiment, the charge storage layer 204 may be formed using doped polysilicon by a low pressure chemical vapor deposition (CVD) process. In another example embodiment, the charge storage layer 204 may be formed using silicon nitride.

A mask (not shown) may be formed on the charge storage layer 204. For example, the mask may be formed to include silicon oxide.

The charge storage layer 204, the tunnel insulation layer 202 and the substrate 200 may be etched using the mask as an etching mask to form a trench. An insulating material may be filled into the trench to form an isolation layer pattern 206. Thus, the substrate 200 may be divided into an active region and a field region. In example embodiments, a plurality of isolation layer patterns 206, each of which may extend in a first direction, may be formed in a second direction substantially perpendicular to the first direction.

During the etching process, the mask may be almost removed. A remaining portion of the mask may be sufficiently removed by an ashing process and/or a stripping process.

Figure 7B:
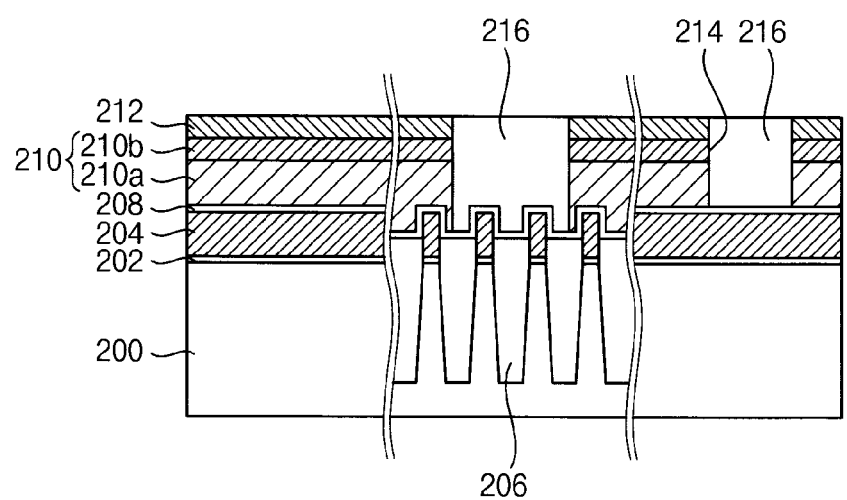

Referring to FIG. 7B, a blocking layer 208 may be formed on the charge storage layer 204 and the isolation layer pattern 206. A portion of the blocking layer 208, which may be positioned in a region in which an SST or a GST may be formed later, may be removed.

A gate electrode layer 210 may be formed on the blocking layer 208. The gate electrode layer 210 may be formed to include a conductive material. For example, the gate electrode layer 210 may be formed to include a doped polysilicon layer 210a and a tungsten layer 210b.

A first hard mask layer 212 may be formed on the gate electrode layer 210. The first hard mask layer 212 may be formed to include, e.g., silicon nitride.

A photoresist pattern (not shown) may be formed on the first hard mask layer 212. The photoresist pattern may expose an area in which word lines may be cut later.

The first hard mask layer 212 and the gate electrode layer 210 may be etched using the photoresist pattern as an etching mask to form an opening 214 exposing the blocking layer 208. The photoresist pattern may be removed by an ashing process and/or an etch back process.

An insulating material (e.g., silicon oxide) may be filled into the opening 214 and an upper portion thereof may be planarized until a top surface of the first hard mask layer 212 may be exposed to form a preliminary insulation layer pattern 216.

Figure 7C:
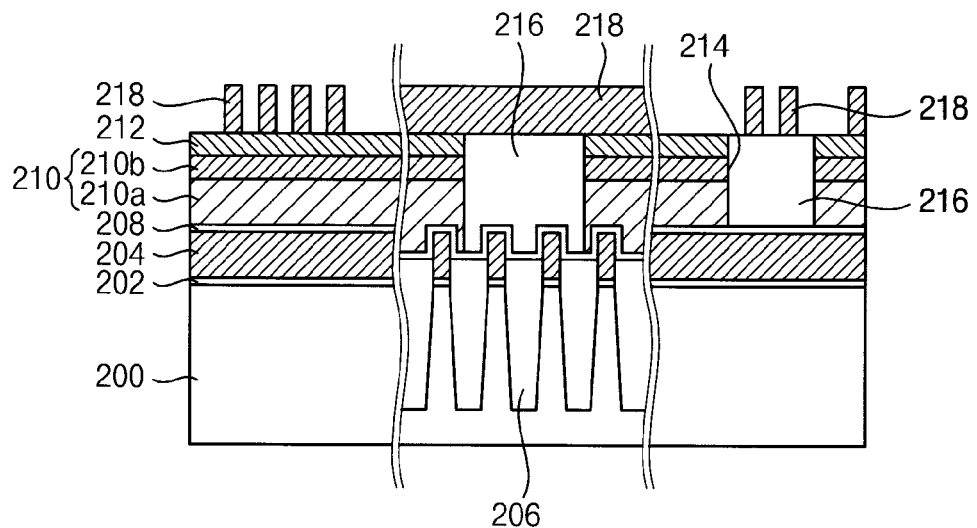

Referring to FIG. 7C, a second hard mask layer (not shown) may be formed on the preliminary insulation layer pattern 216 and the first hard mask layer 212. A QPT process may be performed on the second hard mask layer to form a second hard mask 218.

The method of forming the second hard mask 218 may be substantially the same as that illustrated with reference to FIGS. 2D and 2G Thus, two second hard masks 218 having a closed curve shape may be formed.

Figure 7D:
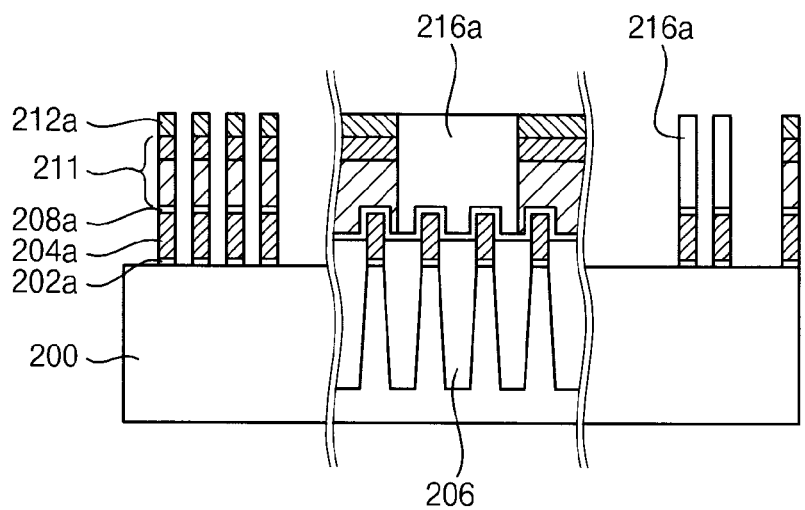

Referring to FIG. 7D, the first hard mask layer 212, the preliminary insulation layer pattern 216, the gate electrode layer 210, the blocking layer 208 and the charge storage layer 204 may be sequentially etched using the second hard mask 218 as an etching mask. The second hard mask 218 may be almost removed during the etching process.

Accordingly, a stacked structure including a tunnel insulation layer pattern 202a, a charge storage layer pattern 204a, a blocking layer pattern 208a, a gate electrode 211 and a hard mask pattern 212a sequentially stacked may be formed. In the area in which the word lines may be cut, a stacked structure including the tunnel insulation layer pattern 202a, the charge storage layer pattern 204a, the blocking layer pattern 208a and an insulation layer pattern 216a sequentially stacked may be formed. A pad 232 (refer to FIG. 6B) may be formed to be electrically connected to a lateral portion of the gate electrode 211.

The second hard mask 218 may have a closed curve shape, and thus the hard mask pattern 212a may have a closed curve shape. The gate electrode 211 and the insulation layer pattern 216a beneath the hard mask pattern 212a may have also a closed curve shape. The gate electrode 211 and the insulation layer pattern 216a may have a shape substantially the same as that of FIG. 3F when viewed from a top side.

The gate electrode 211 divided into two by the insulation layer pattern 216a may serve as two control gates.

The second hard mask 218 may be removed.

Figure 7E:
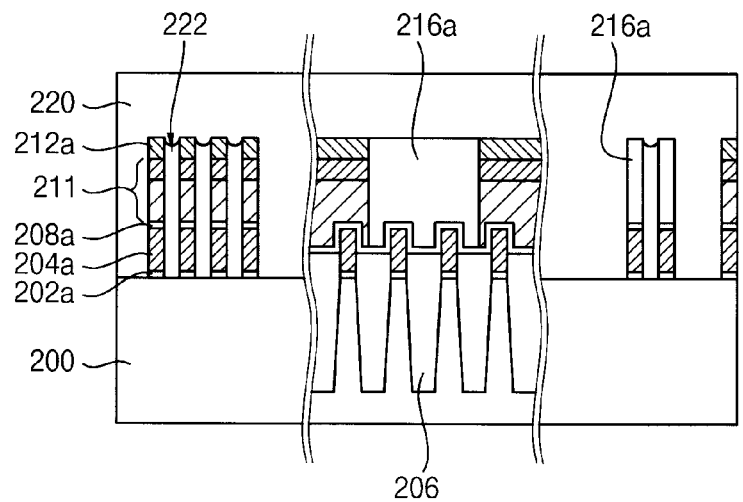

Referring to FIG. 7E, an insulating interlayer 220 may be formed on the substrate 200 to cover an upper portion of the stacked structure. The insulating interlayer 220 may be formed to include, e.g., silicon oxide.

The insulating interlayer 220 may not completely fill a space between the first and second pattern structures 230a and 230b (refer to FIG. 6B) in a first region in which the first and second pattern structures 230a and 230b may be spaced apart from each other at a first distance d1, a space between the first pattern structures 230a, a space between the second pattern structures 230b, or a space between the insulation layer patterns 216a. However, the insulating interlayer 220 may sufficiently fill a space between the first and second pattern structures 230a and 230b in a second region in which the first and second pattern structures 230a and 230b may be spaced apart from each other at a second distance d2 greater that the first distance d1. The insulating interlayer 220 may cover a top surface of the stacked structure. The space that is not filled with the insulating interlayer 220 may be referred to as an air gap 222. The stacked structure may have the closed curve shape, and thus the air gap 222 between the stacked structures may be continuously formed.

The NAND flash memory device manufactured by the above method may have good operation characteristics, e.g., a reduced coupling, a reduced RC delay, etc.

Figure 8A:
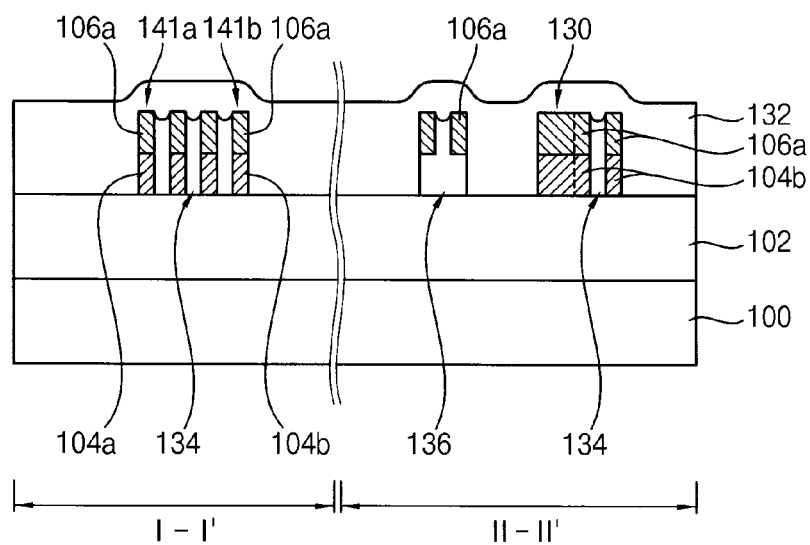
FIG. 8A is a cross-sectional view illustrating a semiconductor device including a conductive line structure in accordance with another example embodiment.
Figure 8B:
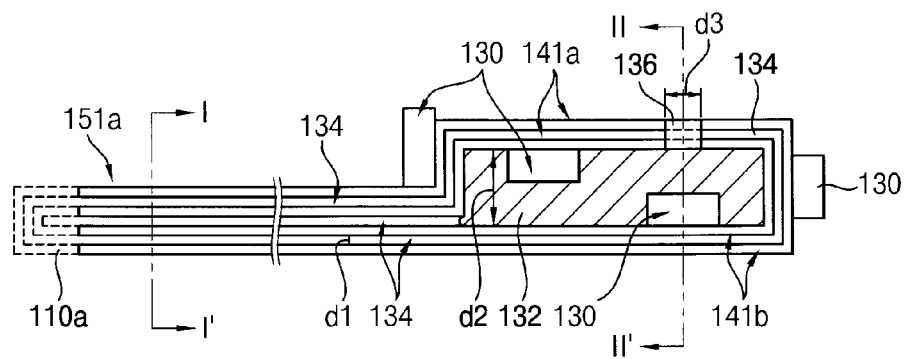
FIG. 8B is a plan view of the semiconductor device of FIG. 8A.
Figure 8C:
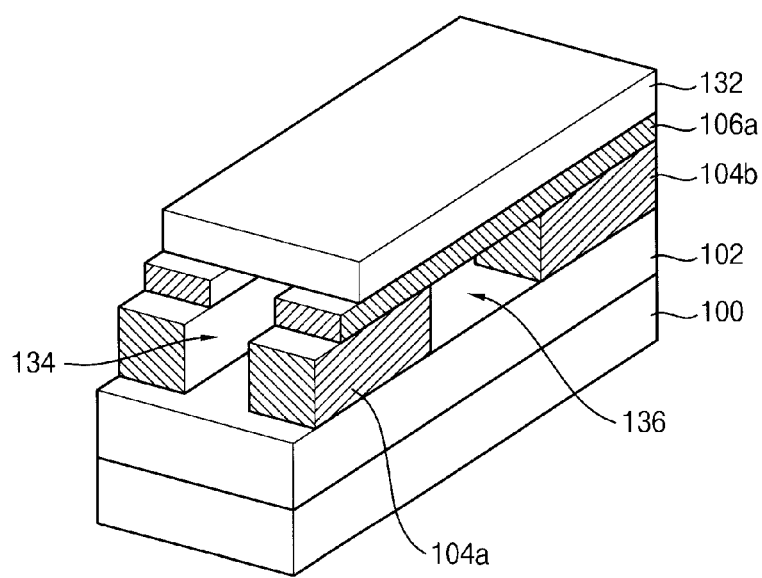
FIG. 8C is a perspective view of a portion of the semiconductor device of FIG. 8A.

FIG. 8A is a cross-sectional view illustrating a semiconductor device including a conductive line structure in accordance with another example embodiment, FIG. 8B is a plan view of the semiconductor device of FIG. 8A, and FIG. 8C is a perspective view of a portion of the semiconductor device of FIG. 8A.

In FIGS. 8A and 8B, the conductive line structure may have an air gap substituted for a portion of the insulation layer pattern 110a of the conductive line structure of FIG. 1A to 1C.

Referring to FIGS. 8A and 8B, a lower structure (e.g., transistors, wirings, etc.) may be formed on a substrate 100. A lower insulating interlayer 102 covering the lower structure may be formed on the substrate 100.

A stacked structure 151a may be formed on the lower insulating interlayer 102.

The stacked structure 151a may have a first pattern structure 141a and a second pattern structure 141b. The first pattern structure 141a may include a first line pattern 104a and a first hard mask 106a sequentially stacked, and the second pattern structure 141b may include a second line pattern 104b and the first hard mask 106a sequentially stacked.

The first and second line patterns 104a and 104b may include a metal, a metal nitride, a metal silicide, doped polysilicon, etc., and may have a single layer or a multi-layered structure. The first and second line patterns 104a and 104b may extend in a first direction and be parallel to each other, and may serve as separated wirings because the first and second line patterns 104a and 104b may not contact with each other.

The first hard mask 106a may be formed on the first and second line patterns 104a and 104b, and may be also formed on a region in which the first and second line patterns 104 and 104b are not formed (i.e., the first hard mask 106a may have a bridge shape in the region). The first hard mask 106a may have a closed curve shape.

A lateral portion of each of the first and second line patterns 104a and 104b may be electrically connected to a pad 130. The pad 130 may have a stacked structure substantially the same as that of the first pattern structure 141a or the second pattern structure 141b.

At least a portion of the first pattern structure 141a or the second pattern structure 141b may be bent so that a space for the pad 130 may be provided.

The first and second pattern structures 141a and 141b may be spaced apart from each other along a second direction substantially perpendicular to the first direction by a first distance d1 in a first region and by a second distance d2 greater than the first distance d1 in a second region. The first and second line patterns 104a and 104b may be spaced apart from each other along the first direction by a third distance d3 greater than the first distance d1.

An insulating interlayer 132 may partially cover the stacked structure 151a, however, may not fill a space between the first pattern structures 141a, a space between the second pattern structures 141b, a space between the first and second pattern structures 141a and 141b in the first region along the second direction, and a space between the first and second line patterns 104a and 104b along the first direction.

Thus, a first air gap 134 may be defined between the first pattern structures 141a, between the second structures 141b, and between the first and second pattern structures 141a and 141b in the first region.

Figure 9A:
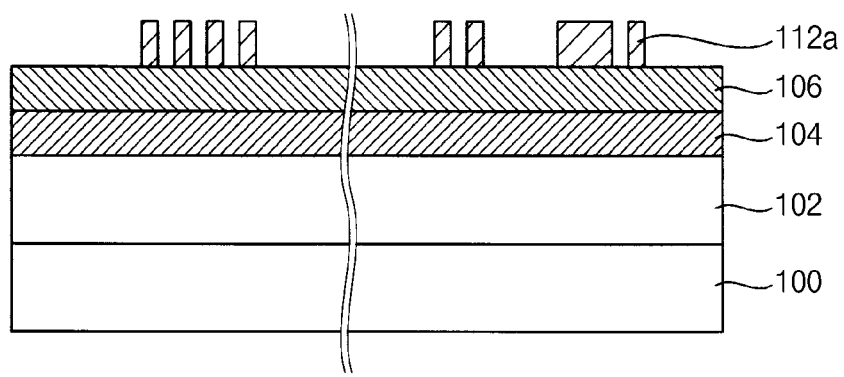
FIGS. 9A to 9C are vertical cross-sectional views illustrating a method of manufacturing the semiconductor device of FIGS. 8A and 8B, and FIGS. 10A to 10C are horizontal cross-sectional views illustrating the method of manufacturing the semiconductor device of FIGS. 8A and 8B.
Figure 9B:
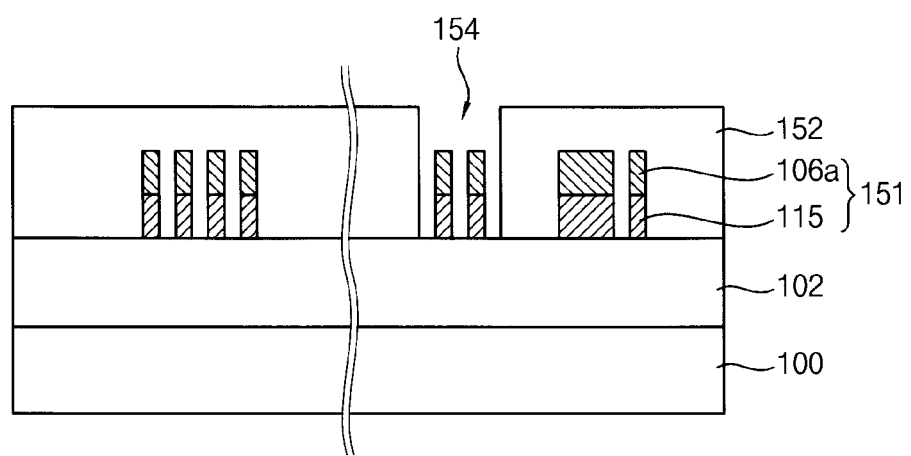
Figure 9C:
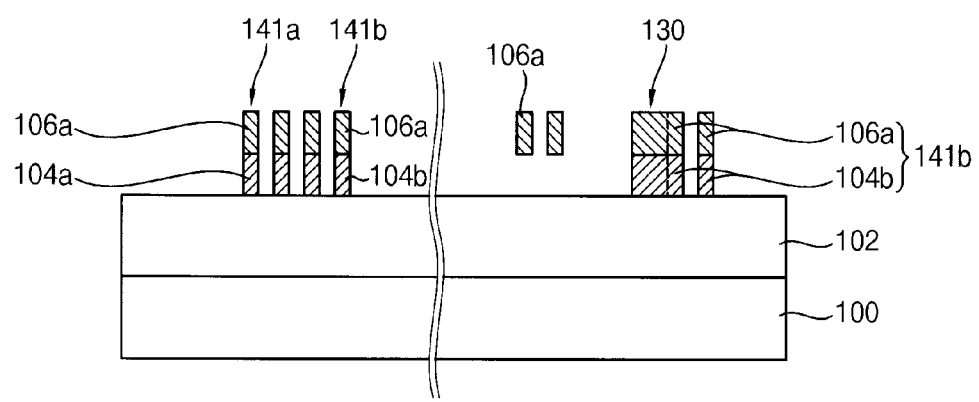

FIGS. 9A to 9C are vertical cross-sectional views illustrating a method of manufacturing the semiconductor device of FIGS. 8A and 8B, and FIGS. 10A to 10C are horizontal cross-sectional views illustrating the method of manufacturing the semiconductor device of FIGS. 8A and 8B.

Referring to FIG. 9A, a lower structure (not shown) may be formed on a substrate 100. A lower insulating interlayer 102 may be formed on the substrate 100 to sufficiently cover the lower structure. A conductive layer 104 may be formed on the lower insulating interlayer 102. A first hard mask layer 106 may be formed on the conductive layer 104.

A second hard mask layer may be formed on the first hard mask layer 106.

A QPT process may be performed on the second hard mask layer to form a second hard mask 112a. Processes for forming the second hard mask 112a may be substantially the same as or similar to those illustrated with reference to FIGS. 2D and 2G.

Figure 10A:
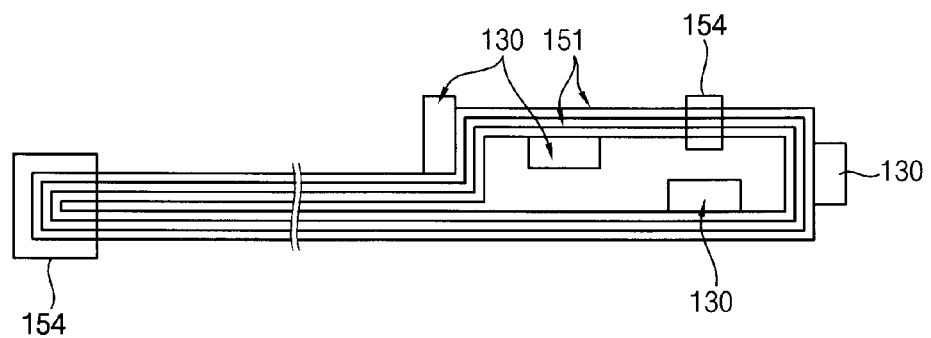

Referring to FIGS. 9B and 10A, the first hard mask layer 106 and the conductive layer 104 may be etched using the second hard mask 112a as an etching mask to form a preliminary stacked structure 151 including a preliminary conductive line 115 and a first hard mask 106a sequentially stacked. The preliminary stacked structure 151 may have a closed curve shape. A pad 130 may be formed on a lateral portion of the preliminary stacked structure 151.

A photoresist pattern 152 covering the preliminary stacked structure 151 and having an opening 154 exposing a portion of the preliminary stacked structure 151 may be formed on the lower insulating interlayer 102.

Referring to FIG. 9C, a portion of the preliminary conductive line 115 exposed by the opening 154 may be removed to form a conductive line including a first line pattern 104a and a second line pattern 104b. The removal of the preliminary conductive line 115 may be performed by an isotropic etching process to form a stacked structure 151a. The stacked structure 151a may have a first pattern structure 141a and a second pattern structure 141b. The first pattern structure 141a may include the first line pattern 104a and the first hard mask 106a sequentially stacked, and the second structure 141b may include the second line pattern 104b and the first hard mask 106a.

Figure 10B:
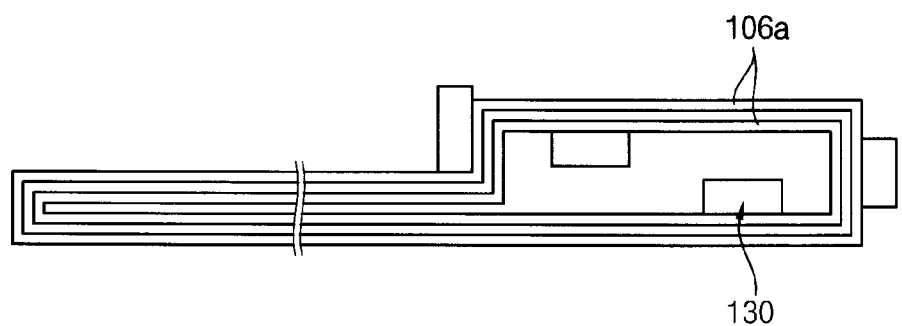

FIG. 10B is a horizontal cross-sectional view of the semiconductor device cut along a plane crossing the first hard mask 106a. A shown in FIG. 10B, in the etching process, the first hard mask 106a may not be removed, and thus may maintain the closed curve shape. The first hard mask 106a may be formed not only on the first and second line patterns 104a and 104b but also on a space generated by removing the portion of the preliminary conductive line 115, and thus may have a bridge shape.

Figure 10C:
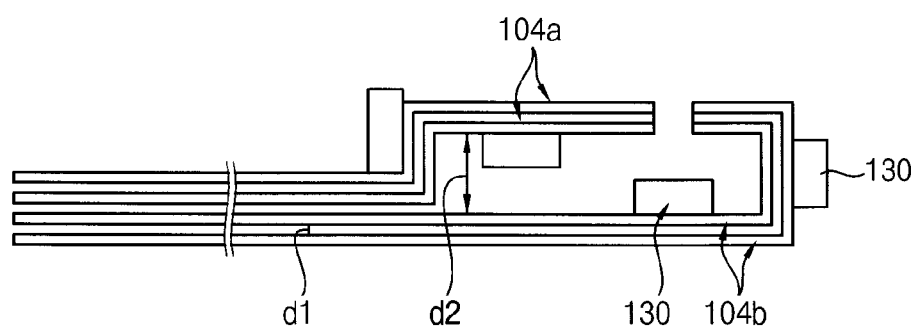

FIG. 10C is a horizontal cross-sectional view of the semiconductor device cut along a plane crossing the conductive line. As shown in FIG. 10C, the conductive line may include the first and second line patterns 104a and 104b separated from each other.

Referring to FIG. 8A again, an insulating interlayer 132 may be formed on the lower insulating interlayer 102 to cover an upper portion of the stacked structure 151a. The insulating interlayer 132 may be formed to include, e.g., silicon oxide.

The insulating interlayer 132 may not completely fill a space between the first and second pattern structures 141a and 141b in a first region, a space between the first pattern structures 141a, a space between the second pattern structures 141b, or a space between the first hard masks 110a. However, the insulating interlayer 132 may sufficiently fill a space between the first and second pattern structures 141a and 141b in a second region. The insulating interlayer 132 may cover a top surface of the stacked structure 151a.

The spaces that are not completely filled with the insulating interlayer 132 may be referred to as a first air gap 134, which may be continuously formed therein. The parasitic capacitance between the first and second line patterns 104a and 104b may be reduced.

Additionally, the space generated by removing the portion of the preliminary conductive line 115 may not be filled by the insulating interlayer 132, and may be referred to as a second air gap 136, which may be in fluid communication with the first air gap 134.

Hereinafter, a NAND flash memory device including the conductive line structure of FIGS. 8A to 8C in accordance with example embodiments and a method of manufacturing the same may be illustrated.

Figure 11:
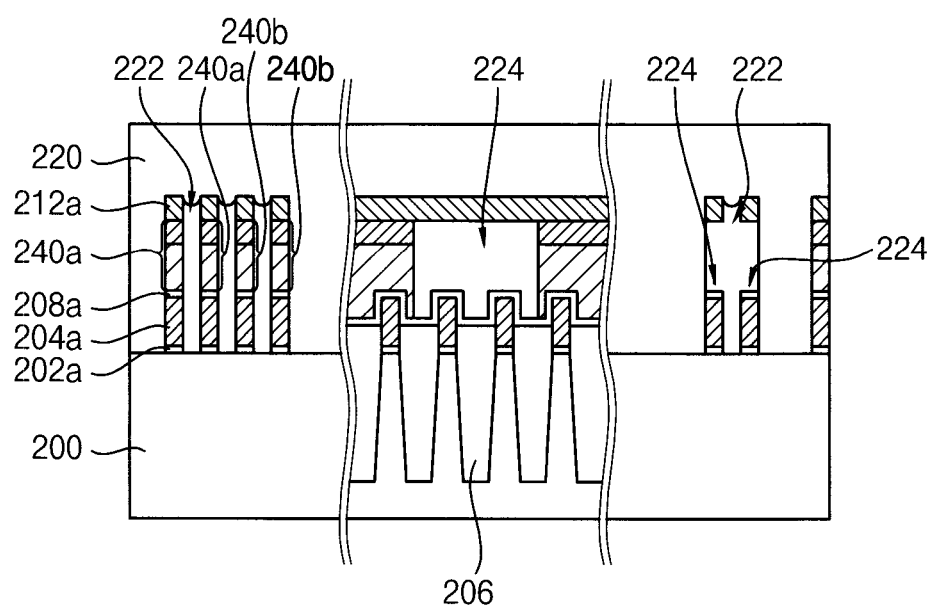

FIG. 11 is a cross-sectional view illustrating a NAND flash memory device in accordance with a further example embodiment.

Referring to FIG. 11, a substrate 200 may be divided into a field region and an active region.

Cell strings may be formed on a cell region of the substrate 200. Each cell string may include a plurality of cell transistors, an SST and a GST.

The cell transistor may have a gate structure including a tunnel insulation layer pattern 202a, a charge storage layer pattern 204a, a blocking layer pattern 208a, a control gate and a hard mask pattern 212a sequentially stacked.

The control gate and the hard mask pattern 212a may correspond to the conductive line structure of FIGS. 8A to 8C.

The control gate may extend in a first direction, and may have first and second line patterns 240a and 240b including a conductive material.

The first and second line patterns 240a and 240b may be physically and electrically disconnected to each other, and may serve as word lines.

The hard mask pattern 212a may have a closed curve shape. The hard mask pattern 212a may be formed on the first and second line patterns 240a and 240b and also formed in a region in which the first and second line patterns 240a and 240b are not formed. Thus, the hard mask pattern 212a may have a bridge shape.

In the region in which the first and second line patterns 240a and 240b are not formed, a tunnel insulation layer pattern 202a, a charge storage layer pattern 204a, a blocking layer pattern 208a, a second air gap 224 and the hard mask pattern 212a may be sequentially stacked.

A pad (not shown) may be electrically connected to a lateral portion of the line patterns 240a and 240b.

An insulating interlayer 220 may cover an upper portion of the gate structure. A space between the first line patterns 240a, a space between the second line patterns 240b, and a space between the first and second line patterns 240a and 240b may not be filled with the insulating interlayer 220 to form a first air gap 222. The hard mask pattern 212a may have a closed curve shape, and thus the first air gap 222 may be formed continuously. The second air gap 224 may be in fluid communication with the first air gap 222.

Figure 12A:
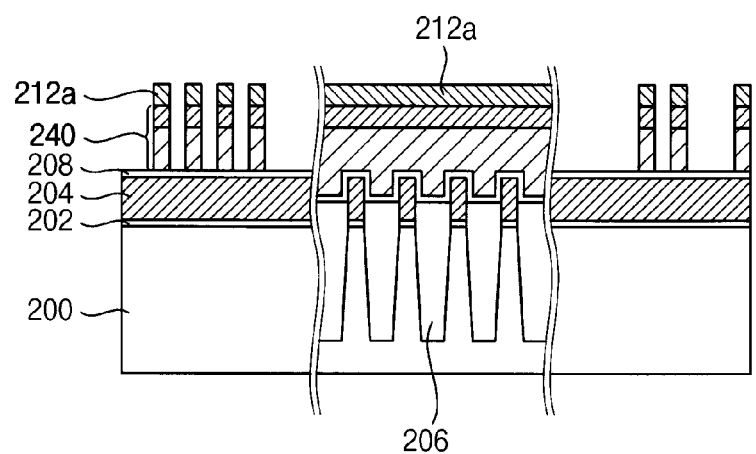
FIGS. 12A to 12C are cross-sectional views illustrating a method of manufacturing the NAND flash memory device of FIG. 11.
Figure 12B:
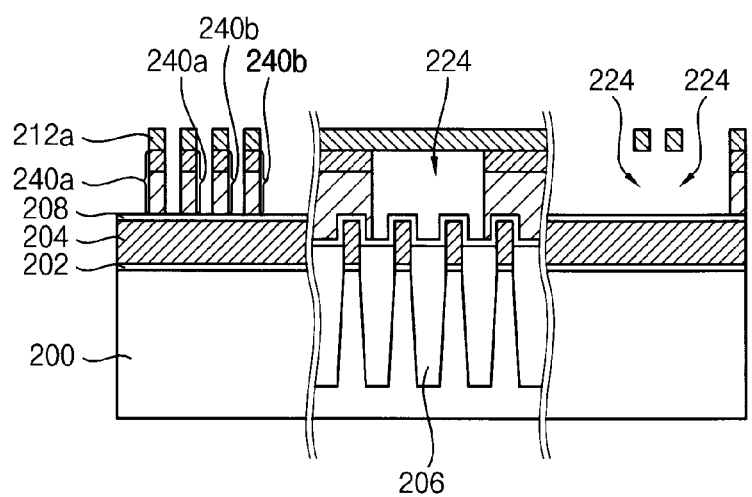
Figure 12C:
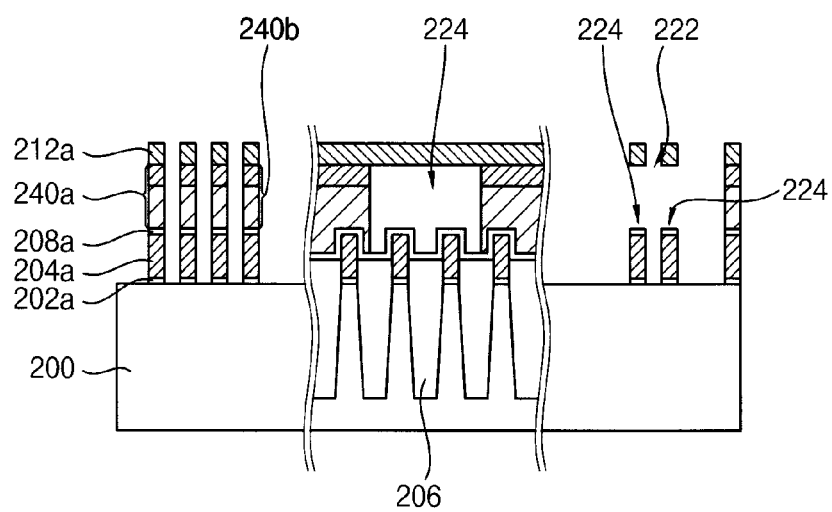

FIGS. 12A to 12C are cross-sectional views illustrating a method of manufacturing the NAND flash memory device of FIG. 11.

First, a process substantially the same as or similar to that illustrated with reference to FIG. 8A may be performed.

Next, referring to FIG. 12A, a blocking layer 208, a gate electrode layer and a first hard mask layer may be formed on the charge storage layer 204 and the isolation layer pattern 206.

A second hard mask layer (not shown) may be formed on the first hard mask layer. A QPT process may be performed on the second hard mask layer to form a second hard mask (not shown). Processes for forming the second hard mask may be substantially the same as or similar to those illustrated with reference to FIGS. 2D and 2G.

The first hard mask layer and the gate electrode layer may be etched using the second hard mask as an etching mask to form a hard mask pattern 212a, and a preliminary line pattern 240 and a pad (not shown), respectively. The hard mask pattern 212a and the preliminary line pattern 240 may have a closed curve shape.

Referring to FIG. 12B, a photoresist pattern (not shown) exposing portions of the hard mask pattern 212a and the preliminary line pattern 240 may be formed on the blocking layer 208.

The exposed portion of the preliminary line pattern 240 may be removed by an isotropic etching process.

During the etching process, the preliminary line pattern 240 may be divided into a first line pattern 240a and a second line pattern 240b, and a space may be generated between the first and second line patterns 240a and 240b in the second direction. The space may be referred to as a second air gap 224. The first and second line patterns 240a and 240b may serve as control gates.

In the etching process, the hard mask pattern 212a may not be removed, and thus the hard mask pattern 212a may have a bridge shape.

Referring to FIG. 12C, the blocking layer 208 and the charge storage layer 204 may be sequentially etched using the hard mask pattern 212a as an etching mask to form a blocking layer pattern 208a and a charge storage layer pattern 204a, respectively. Accordingly, a plurality of gate structures included in cell transistors may be formed.

The hard mask pattern 212a may have a closed curve shape, and first and second line patterns 240a and 240b separated from each other may be formed beneath the hard mask pattern 212a.

Referring to FIG. 11 again, an insulating interlayer 220 may be formed on the substrate 200 to cover an upper portion of the gate structure. The insulating interlayer 220 may be formed to include, e.g., silicon oxide.

The insulating interlayer 220 may not cover a space between the first line patterns 240a, a space between the second line patterns 240b, or a space between the first and second line patterns 240a and 240b in the second direction to form a first air gap 222. The hard mask pattern 212a may have a closed curve shape, and thus the first air gap 222 may be formed continuously. The second air gap 224 may be in fluid communication with the first air gap 222.

Figure 13A:
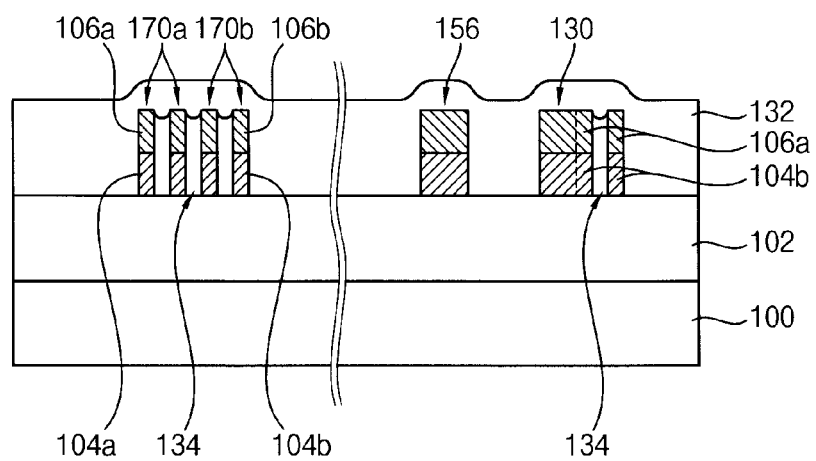
FIG. 13A is a cross-sectional view illustrating a semiconductor device including a conductive line structure in accordance with yet another example embodiment.
Figure 13B:
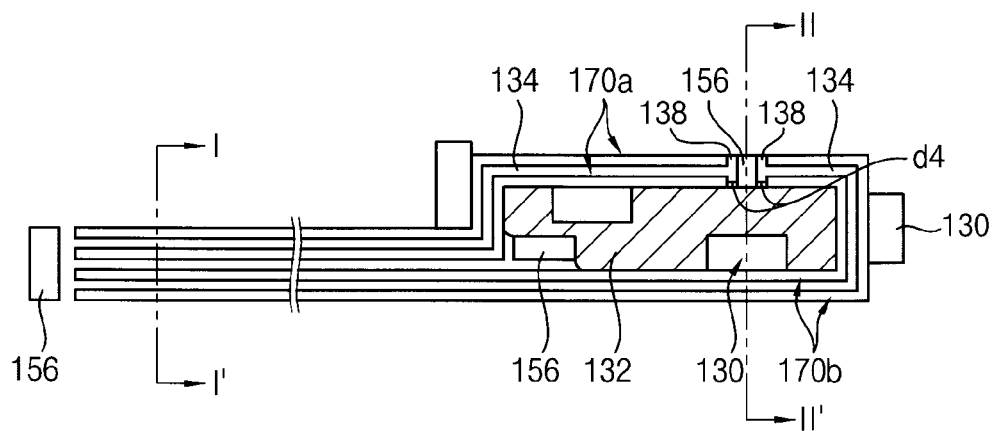
FIG. 13B is a plan view of the semiconductor device of FIG. 13A.

FIG. 13A is a cross-sectional view illustrating a semiconductor device including a conductive line structure in accordance with yet another example embodiment, and FIG. 13B is a plan view of the semiconductor device of FIG. 13A. Particularly, FIG. 13A is a cross-sectional view cut along the lines I-I' and II-II'.

Referring to FIGS. 13A and 13B, a lower structure (not shown) may be formed on a substrate 100. A lower insulating interlayer 102 sufficiently covering the lower structure may be formed on the substrate 100.

First and second pattern structures 170a and 170b may be formed on the lower insulating interlayer 102.

The first pattern structure 170a may include a first line pattern 104a and a first hard mask 106a sequentially stacked, and the second pattern structure 170b may include a second line pattern 104b and the first hard mask 106a sequentially stacked. The first and second pattern structures 170a and 170b may be formed by cutting a portion of a pattern structure having a closed curve shape. In an example embodiment, the first and second pattern structures 170a and 170b may extend in a first direction.

A lateral portion of each of the first and second pattern structures 170a and 170b may be electrically connected to a pad 130. The pad 130 may have a stacked structure substantially the same as that of the first pattern structure 170a or the second pattern structure 170b.

At least a portion of the first pattern structure 170a or the second pattern structure 170b may be bent so that a space for forming the pad 130 may be provided.

The first and second pattern structures 170a and 170b may be spaced apart from each other along a second direction substantially perpendicular to the first direction by a first distance d1 in a first region and by a second distance d2 greater than the first distance d1 in a second region.

A dummy pattern 156 may be formed between the first and second pattern structures 170a and 170b in a region in which the portion of the pattern structure is cut. Additionally, the dummy pattern 156 may be formed near a region in which the portion of the first pattern structure 170a or the second pattern structure 170b is bent.

In example embodiments, a plurality of first pattern structures 170a and a plurality of second pattern structures 170b may be formed, and in this case, the first pattern structures 170a may be spaced apart from each other by the first distance d1 in the second direction, the second pattern structures 170b may be spaced apart from each other by the first distance d1 in the second direction, and the first and second pattern structures 170a and 170b may be spaced apart from each other by the first distance d1 in the first region in the second direction.

Additionally, the dummy pattern 156 and the first pattern structure 170a or the second pattern structure 170b may be spaced apart from each other at a fourth distance d4 substantially the same as or similar to the first distance d1. For example, the fourth distance d4 may be equal to, or less than, about 30 nm. The dummy pattern 156 may have a stacked structure substantially the same as that of the first pattern structure 170a or the second pattern structure 170b.

An insulating interlayer 132 may partially cover upper portions of the first and second pattern structures 170a and 170b. The insulating interlayer 132 may not fill a space between the first pattern structures 170a in the second direction, a space between the second pattern structures 170b in the second direction, or a space between the first and second pattern structures 170a and 170b in the second direction in the first region. The insulating interlayer 132 may not fill a space between the dummy pattern 156 and the first pattern structure 170a or the second pattern structure 170b in the first direction.

The spaces between the first pattern structures 170a, between the second pattern structures 170b, between the first and second pattern structures 170a and 170 may be referred to as a first air gap 134. The space between the dummy pattern 156 and the first pattern structure 170a or the second pattern structure 170b may be referred to as a third air gap 138. The third air gap 138 may be in fluid communication with the first air gap 134.

FIGS. 14A to 14D are cross-sectional views illustrating a method of manufacturing the semiconductor device of FIGS. 13A and 13B, and FIGS. 15A to 15C are plan views of the semiconductor device of FIGS. 14A to 14D.

Figure 14A:
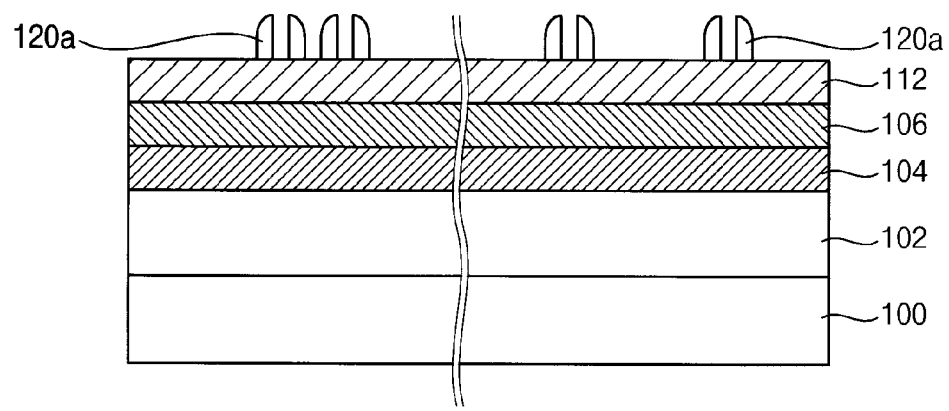
FIGS. 14A to 14D are cross-sectional views illustrating a method of manufacturing the semiconductor device of FIGS. 13A and 13B, and FIGS. 15A to 15C are plan views of the semiconductor device of FIGS. 14A to 14D.
Figure 15A:
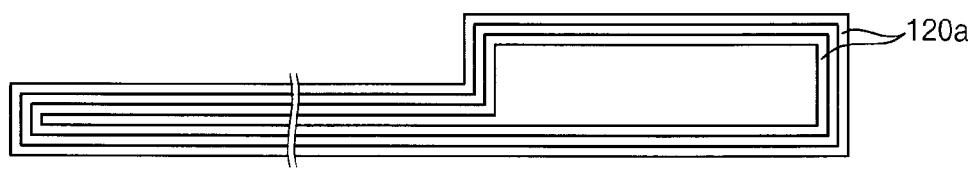

Referring to FIGS. 14A and 15A, a lower structure (not shown) may be formed on a substrate 100. A lower insulating interlayer 102 may be formed on the substrate 100 to sufficiently cover the lower structure. A conductive layer 104 may be formed on the lower insulating interlayer 102. A first hard mask layer 106 may be formed to include an insulating material on the conductive layer 104. A second hard mask layer 112 may be formed on the first hard mask layer 106.

A preliminary spacer 120a may be formed on the second hard mask layer 112. The preliminary spacer 120a may have a closed curve shape. A process for forming the preliminary spacer 120a may be substantially the same as that illustrated with reference to FIGS. 2D and 2E.

Figure 14B:
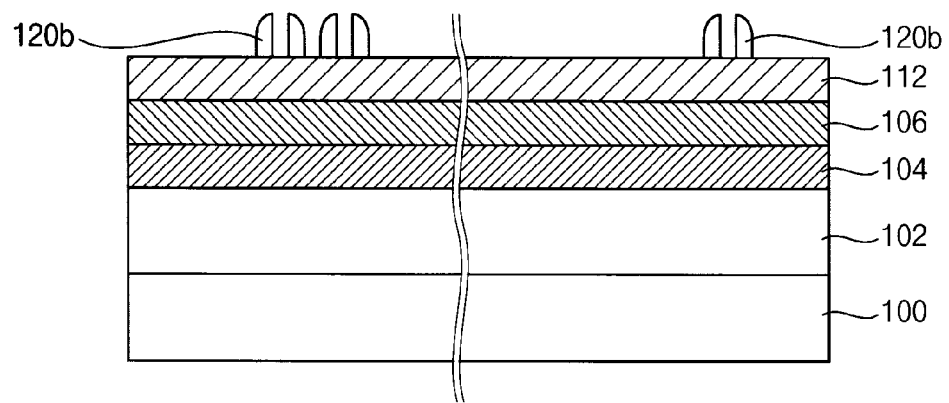
Figure 15B:
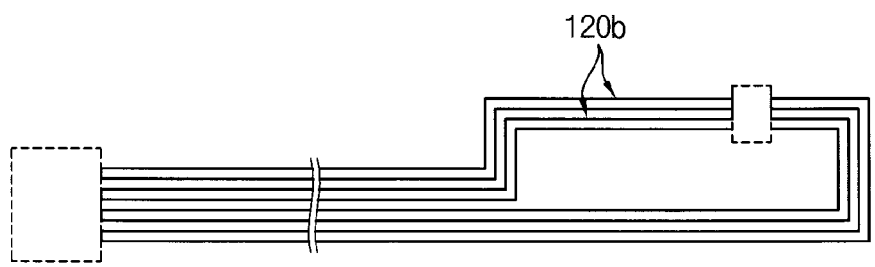

Referring to FIGS. 14B and 15B, a first photoresist pattern (not shown) exposing a portion of the preliminary spacer 120a may be formed on the preliminary spacer 120a and the second hard mask layer 112.

The preliminary spacer 120a may be etched using the first photoresist pattern as an etching mask to foim a spacer 120b. The spacer 120b may have four lines that may be generated from two closed curve shaped lines by cutting portions of the two closed curve shaped lines.

The photoresist pattern may be removed.

Figure 14C:
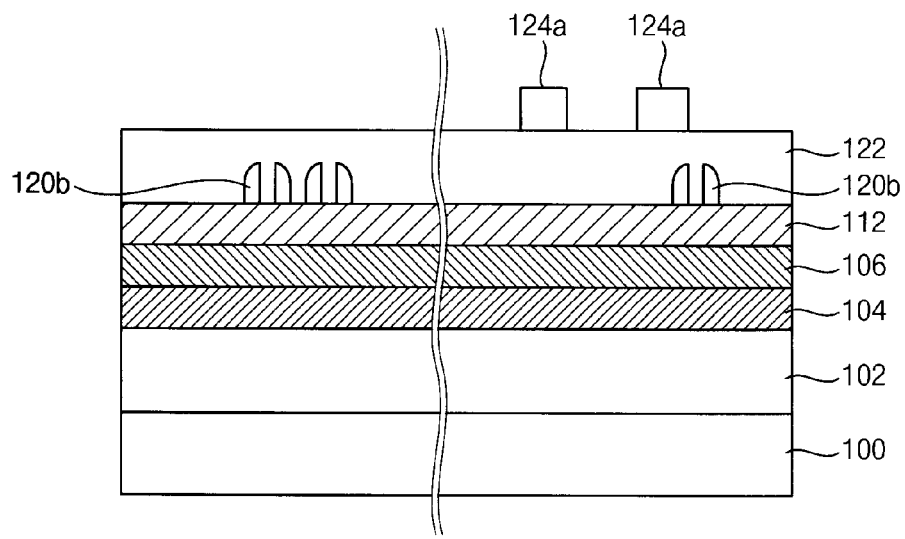

Referring to FIG. 14C, a sacrificial layer 122 may be formed on the second hard mask layer 112 to sufficiently cover the spacer 120b. The sacrificial layer 122 may be formed to include, e.g., spin on hard mask (SOH).

A second photoresist pattern 124a may be formed on the sacrificial layer 122. The second photoresist pattern 124a may serve as an etching mask for forming a pad 130 (refer to FIG. 14D) and a dummy pattern 156 (refer to FIG. 14D).

Figure 14D:
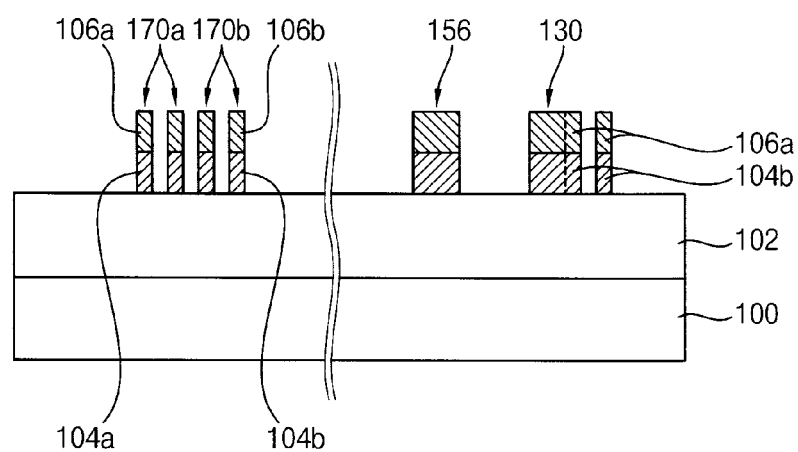
Figure 15C:
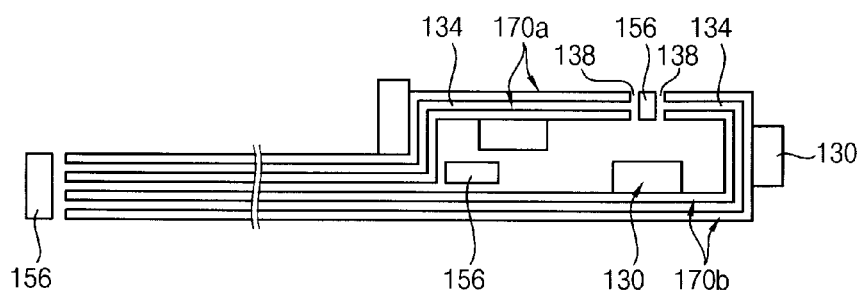

Referring to FIGS. 14D and 15C, the sacrificial layer 122 may be etched using the second photoresist pattern 124a as an etching mask. The second hard mask layer 122 may be etched using the spacer 120b and the second photoresist pattern 124a as an etching mask to form a second hard mask (not shown).

The first hard mask layer 106 and the conductive layer 104 may be etched using the second hard mask as an etching mask to form first and second pattern structures 170a and 170b. The first pattern structure 170a may include a first line pattern 104a and a first hard mask 106a sequentially stacked, and the second pattern structure 170b may include a second line pattern 104b and the first hard mask 106a sequentially stacked.

The dummy pattern 156 may be formed between the first and second pattern structures 170a and 170b, and the pad 130 may be formed at a lateral portion of the first and second pattern structures 170a and 170b.

Referring to FIG. 13A again, an insulating interlayer 132 may be formed on the lower insulating interlayer 102 to cover an upper portion of the first and second pattern structures 170a and 170b. The insulating interlayer 132 may be formed to include, e.g., silicon oxide.

The insulating interlayer 132 may not completely fill a space between the first and second pattern structures 170a and 170b in a first region in a second direction, a space between the first pattern structures 170a in the second direction, a space between the second pattern structures 170b in the second direction, or a space between the dummy pattern 156 and the first pattern structure 170a or the second pattern structure 170b in the first direction. However, the insulating interlayer 132 may sufficiently fill a space between the first and second pattern structures 141a and 141b in a second region in the second direction. The insulating interlayer 132 may cover upper portions of the first and second pattern structures 170a and 170b and the dummy pattern 156.

The spaces between the first pattern structures 170a, between the second pattern structures 170b, between the first and second pattern structures 170a and 170 may be referred to as a first air gap 134. The space between the dummy pattern 156 and the first pattern structure 170a or the second pattern structure 170b may be referred to as a third air gap 138. The third air gap 138 may be in fluid communication with the first air gap 134.

Figure 16:
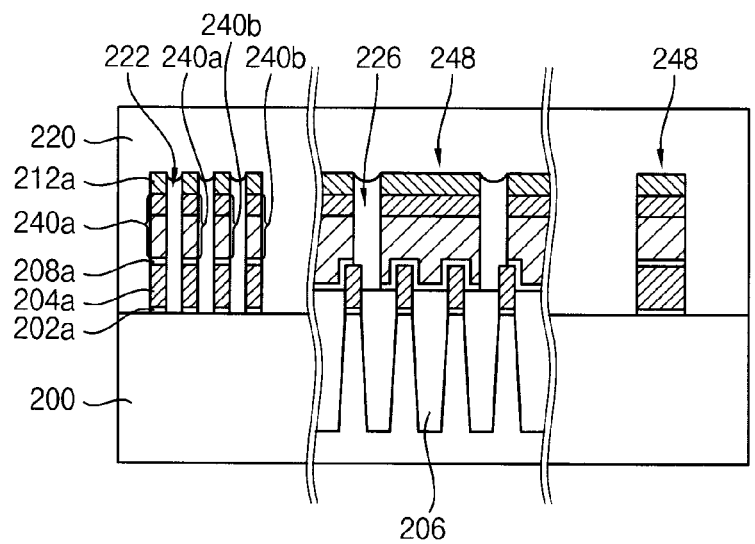

FIG. 16 is a NAND flash memory device in accordance with still another example embodiment.

Referring to FIG. 16, a substrate 200 may include a field region and an active region.

Cell strings may be formed in a cell region of the substrate 200. Each cell string may include cell transistors, an SST and a GST. In example embodiments, the cell transistors may be formed at a central portion of each cell string, and the SST and the GST may be formed, e.g., at rightmost and leftmost portions of each cell string, respectively.

Each cell transistor may include a tunnel insulation layer pattern 202a, a charge storage layer pattern 204a, a blocking layer pattern 208a, a first control gate 240a or a second control gate 240b, and a hard mask pattern 212a sequentially stacked on the substrate 200. A control gate having a closed curve shape may be cut into two, i.e., the first and second control gates 240a and 240b, and may serve as two independent word lines. The control gates 240a and 240b may include a conductive material.

At least a portion of the first control gate 240a or the second control gate 240b may be bent. A space between the first control gates 240a, a space between the second control gates 240b, and a space between the first and second control gates 240a and 240b in a first region may be referred to as a first air gap 222, and a space between the first and second control gates 240a and 240b in a second region may be referred to as a second air gap (not shown). Additionally, a space between the dummy pattern 156 and the first control gate 240a or the second control gate 240b may be referred to as a fourth air gap 226.

A lateral portion of each of the first and second control gates 240a and 240b may be electrically connected to a pad (not shown).

An insulating interlayer 220 covering the above stacked structures may be formed on the substrate 200.

The insulating interlayer 220 may not completely fill the first air gap 222, however, may sufficiently fill the second air gap. Additionally, the insulating interlayer 220 may not completely fill the fourth air gap 226.

Figure 17A:
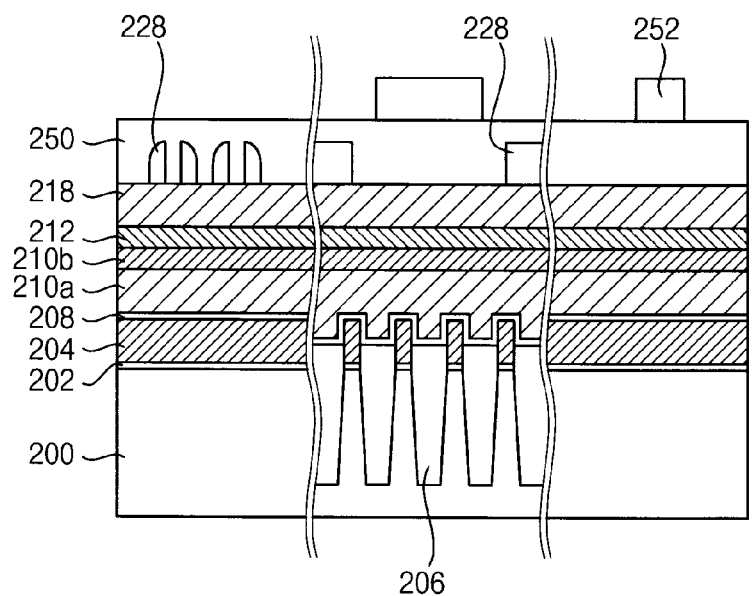
FIGS. 17A and 17B are cross-sectional views illustrating a method of manufacturing the NAND flash memory device of FIG. 16.
Figure 17B:
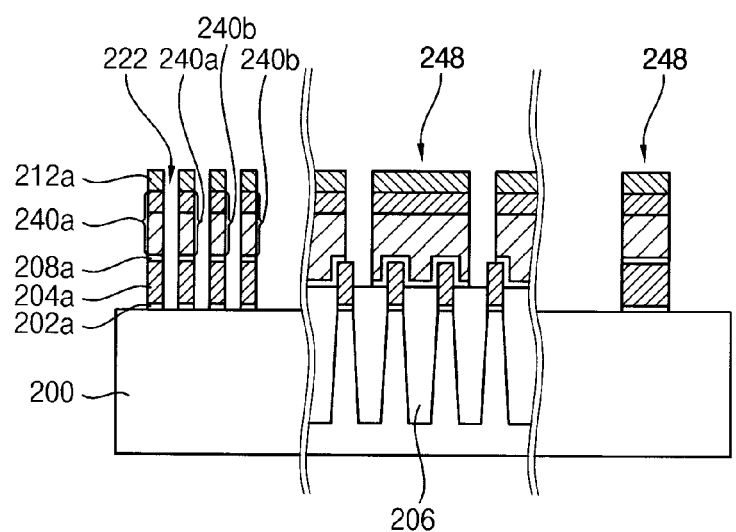

FIGS. 17A and 17B are cross-sectional views illustrating a method of manufacturing the NAND flash memory device of FIG. 16.

First, processes substantially the same as or similar to those illustrated with reference to FIGS. 8A to 8D may be performed.

Next, Referring to FIG. 17A, a second hard mask layer 218 may be formed on the first hard mask layer 212. A QPT process may be performed on the second hard mask layer 218 to form a second spacer (not shown). The second spacer may be formed by processes substantially the same as those illustrated with reference to FIGS. 2D and 2E.

A first photoresist pattern (not shown) may be formed on the second spacer and the second hard mask layer 218. The first photoresist pattern may expose a portion of the second spacer. The second spacer may be etched using the first photoresist pattern as an etching mask so that masks 228 separated from each other may be formed. The first photoresist pattern may be removed.

A sacrificial layer 250 may be formed on the second hard mask layer 218 to sufficiently cover the masks 228. A second photoresist pattern 252 may be formed on the sacrificial layer 250. The second photoresist pattern 252 may serve as an etching mask for forming a dummy pattern and a pad.

Referring to FIG. 17B, the sacrificial layer 250 may be etched using the second photoresist pattern 252 as an etching mask. The first hard mask layer 212 may be etched using the masks 228 as an etching mask to form a hard mask pattern 212a.

The tungsten layer 210b and the doped polysilicon layer 210a, the blocking layer 208, the charge storage layer 204 and the tunnel insulation layer 202 may be sequentially etched using the hard mask pattern 212a to form a gate structure including a tunnel insulation layer pattern 202a, a charge storage layer pattern 204a, a blocking layer pattern 208a, a control gate 240a and the hard mask pattern 212a sequentially stacked.

Referring to FIG. 16 again, an insulating interlayer 220 covering the gate structure may be formed on the substrate 200. The insulating interlayer 220 may not completely fill the first air gap 222, and thus a parasitic capacitance between the gate structures may be reduced.

The NAND flash memory device may have good characteristics, e.g., a reduced coupling, a reduced RC delay, etc.

Figure 18:
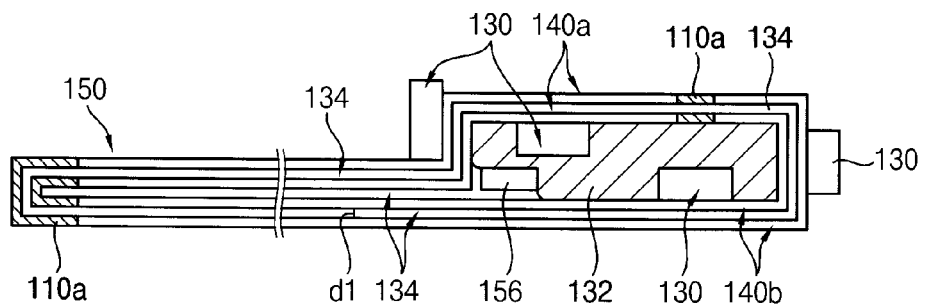
FIG. 18 is a plan view illustrating a semiconductor device including a conductive line structure in accordance with a still further example embodiment.

FIG. 18 is a plan view illustrating a semiconductor device including a conductive line structure in accordance with a still further example embodiment. The conductive line structure may be substantially the same as that of FIGS. 1A to 1C, except for a dummy pattern and a fifth air gap.

Referring to FIG. 18, a substrate (not shown) may include a lower structure (not shown) thereon. The lower structure may include transistors, lower wirings, etc. A lower insulating interlayer (not shown) covering the lower structure may be formed on the substrate.

A stacked structure 150 having a closed curve shape when viewed from a top side may be formed on the lower insulating interlayer. In example embodiments, a plurality of stacked structures 150 may be formed, and two stacked structures 150 are shown in FIG. 18.

The stacked structure 150 may include a first pattern structure 140a, a second pattern structure 140b and an insulation layer pattern 110a. The stacked structure 150 may be substantially the same as that of FIGS. 1A to 1C.

A dummy pattern 156 may be formed in a region in which the first and second pattern structures 140a and 140b may be bent, and a fifth gap may be formed near the dummy pattern 156.

An insulating interlayer 132 covering the stacked structure 150 may be formed on the substrate 100. A first air gap 134 may be formed between the stacked structures 150.

Figure 19:
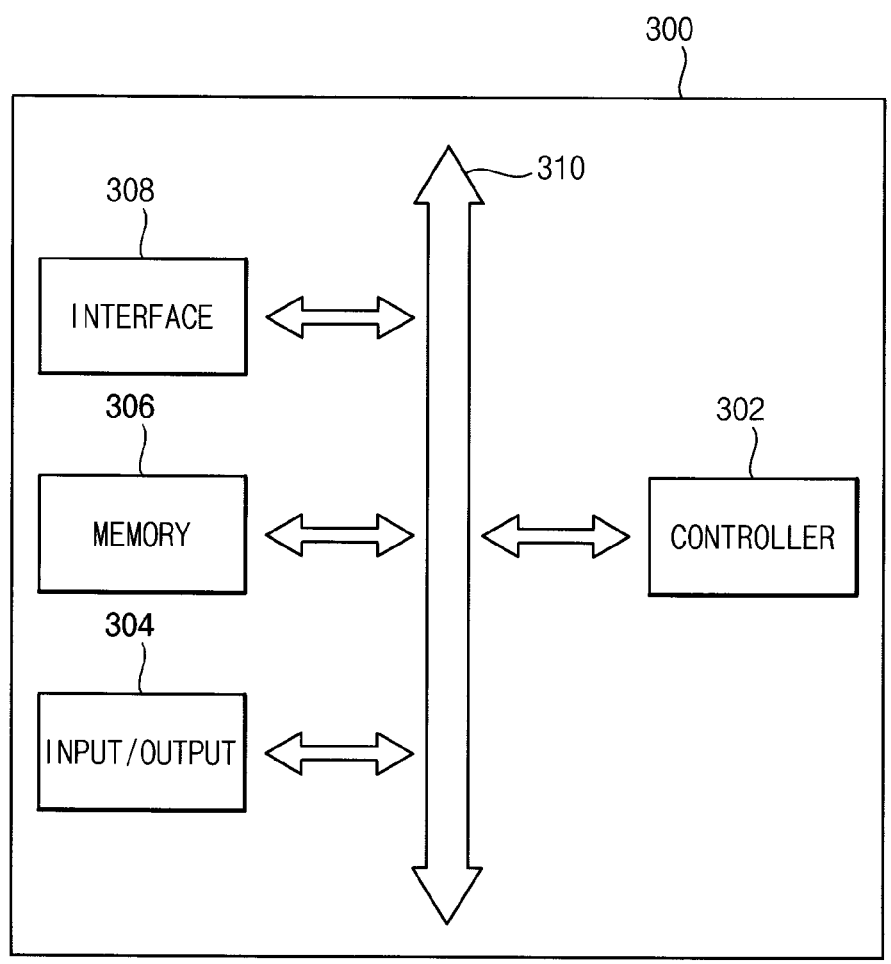
FIG. 19 is an electronic system including a conductive line structure in accordance with an example embodiment.

FIG. 19 is an electronic system including a conductive line structure in accordance with an example embodiment.

Referring to FIG. 19, an electronic system 300 may include a controller 302, an input/output device 304, a memory 306 and an interface 308. The electronic system 300 may be a mobile system or a system configured for transferring or receiving data. The mobile system may be a PDA, a portable computer, a web tablet, a wireless phone, a mobile phone, a digital music player, or a memory card. The controller 302 may execute a program and control the electronic system 300. For example, the controller 302 may be a microprocessor, a digital signal processor, a microcontroller, and the like. The input/output device 304 may input or output data into or from the electronic system 300. The electronic system 300 may be connected to an outer device, e.g., a personal computer or a network to exchange data using the input/output device 304. The input/output device 304 may be, e.g., a keypad, a keyboard or a display device. The memory 306 may store data or codes for operating the controller 302 or data processed by the controller 302. The memory 306 may include a NAND flash memory in accordance with example embodiments. The interface 308 may be a data transfer path between the electronic system 300 and an outer device. The controller 302, the input/output device, the memory 306 and the interface 308 may communicate with each other by a bus 310. For example, the electronic system 300 may be used in a mobile phone, an MP3 player, a navigation system, a portable multimedia player (PMP), a solid state disk (SSD) or household appliances.

As illustrate above, a conductive line having a minute width and an air gap may be formed, and thus a highly integrated semiconductor device may be manufactured.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A conductive line structure, comprising:
a first pattern structure including a first conductive line pattern and a first hard mask sequentially stacked, the first pattern structure extending in a first direction;

a second pattern structure including a second conductive line pattern and a second hard mask sequentially stacked, at least a portion of the second pattern structure extending in the first direction;

insulation layer patterns contacting end portions of the first and second pattern structures, the first pattern structure and a first insulation layer pattern of the insulation layer patterns forming a first closed curve shape in plan view, and the second pattern structure and a second insulation layer pattern of the insulation layer patterns forming a second closed curve shape in plan view; and an insulating interlayer covering upper portions of the first and second pattern structures and the insulation layer patterns, a first air gap between the first and second pattern structures, and a second air gap between the insulation layer patterns.

2. The conductive line structure of claim further comprising:

a third pattern structure including a third conductive line pattern and a third hard mask sequentially stacked; and a fourth pattern structure including a fourth conductive line pattern and a fourth hard mask sequentially stacked, the first pattern structure, the first insulation layer pattern, the third pattern structure and a third insulation layer pattern of the insulation layer patterns forming the first closed curve shape, the second pattern structure, the second insulation layer pattern, the fourth pattern structure and. a fourth insulation layer pattern of the insulation layer patterns forming the second closed curve shape, and the first and second closed curve shapes being parallel to each other.

3. The conductive line structure of claim 2, wherein the first and second air gaps are in fluid communication with each other to form a third closed curve shape in plan view.

4. The conductive line structure of claim 1, further comprising:

a third pattern structure including a third conductive line pattern and a third hard mask sequentially stacked, the first pattern structure, the first insulation layer pattern, the third pattern structure and a third insulation layer pattern of the insulation layer patterns being sequentially arranged in the first closed curve shape.

5. The conductive line structure of claim 1, wherein the insulation layer patterns include at least one of silicon oxide and silicon nitride.

6. The conductive line structure of claim 1, wherein the insulation layer patterns include a material different from materials included in the first and second hard masks.

7. The conductive line structure of claim 1, wherein the first and second conductive line patterns include at least one selected from a metal, a metal nitride, a metal silicide and polysilicon.

8. The conductive line structure of claim 1, further comprising:

a pad on a lateral portion of each of the first and second pattern structures.

9. The conductive line structure of claim 8, wherein the pad has a stacked structure substantially the same as a stacked structure of the first pattern structure or a stacked structure of the second pattern structure.

10. The conductive line structure of claim 1, wherein the first and second air gaps have a width equal to, or less than, about 30 nm.

11. The conductive line structure of claim 1, wherein, the insulation layer patterns are only between the first and second hard masks, and the insulation layer patterns have a material substantially the same as materials included in the first and second hard masks.

12. A conductive line structure, comprising:

a bilayer structure including a double-walled pattern and insulation layer patterns, the double-wailed pattern having first and second wall patterns each with respective ends adjoined to each other via one of the insulation layer patterns so as to form a closed loop in plan view, the first and second wall patterns being separated from each other by a first gap containing a first gas, and at least one the first and second wall patterns including two walls partially separated from each other by a second gap containing a second gas.

13. The conductive line structure of claim 12, wherein at least one of the first and second gases is air.

14. The conductive line structure of claim 12, wherein, the first and second wall patterns each include two walls partially separated from each other by a gap containing a gas, and the first and second wall patterns are arranged symmetrically with reference to a line extending between the first and second wall patterns.

15. The conductive line structure of claim 12, further comprising:

at least one pad contacting a sidewall of at least one of the first and second wall patterns.

16. The conductive line structure of claim 12, wherein a distance between the first wall pattern and the second wall pattern is consistent.

* * * * *